(12) United States Patent
Kawasaki et al.

(10) Patent No.: US 9,054,078 B2
(45) Date of Patent: Jun. 9, 2015

(54) SIGNAL PROCESSING DEVICE

(75) Inventors: Kenichi Kawasaki, Tokyo (JP); Yusuke Tanaka, Tokyo (JP); Hiroyuki Yamagishi, Tokyo (JP); Ali Hajimiri, Tokyo (JP)

(73) Assignee: SONY CORPORATION (JP)

( * ) Notice: Subject to any disclaimer, the term of this patent is extended or adjusted under 35 U.S.C. 154(b) by 147 days.

(21) Appl. No.: 13/368,838

(22) Filed: Feb. 8, 2012

(65) Prior Publication Data
US 2013/0205049 A1 Aug. 8, 2013

(51) Int. Cl.
*G06F 3/00* (2006.01)
*H01L 23/48* (2006.01)
*H01L 23/66* (2006.01)
*H01L 25/10* (2006.01)
*H05K 1/02* (2006.01)
*H01L 25/065* (2006.01)
*H05K 1/18* (2006.01)

(52) U.S. Cl.
CPC *H01L 23/48* (2013.01); *G06F 3/00* (2013.01); *H01L 23/66* (2013.01); *H01L 25/0655* (2013.01); *H01L 25/105* (2013.01); *H01L 2223/6627* (2013.01); *H01L 2223/6677* (2013.01); *H01L 2225/1011* (2013.01); *H01L 2224/16145* (2013.01); *H01L 2224/16227* (2013.01); *H01L 2924/13091* (2013.01); *H05K 1/0274* (2013.01); *H05K 1/181* (2013.01); *H05K 2201/10121* (2013.01)

(58) Field of Classification Search
USPC .......................................................... 710/33
See application file for complete search history.

(56) References Cited

U.S. PATENT DOCUMENTS

| 7,471,175 B2 * | 12/2008 | Voss ............................... 333/247 |
| 2007/0207831 A1 * | 9/2007 | Tinsley et al. ............. 455/556.1 |
| 2011/0026443 A1 * | 2/2011 | Okada et al. ................... 370/280 |

FOREIGN PATENT DOCUMENTS

| JP | H10-285181 | 10/1998 |
| JP | 2003-179821 | 6/2003 |
| JP | 2011-259092 | 12/2011 |
| WO | WO 2011/025027 | 3/2011 |

OTHER PUBLICATIONS

International Search Report (with English translation) for International (PCT) Patent Application No. PCT/JP2013/052176 mailed Mar. 12, 2013, 7 pages.

* cited by examiner

*Primary Examiner* — Idriss N Alrobaye
*Assistant Examiner* — Dayton Lewis-Taylor
(74) *Attorney, Agent, or Firm* — Sheridan Ross P.C.

(57) ABSTRACT

A signal processing device includes: signal processing circuits. The signal processing circuit includes an input/output circuit configured by an input circuit serving as an input interface of a signal of a predetermined frequency band and/or an output circuit serving as an output interface of a signal of the frequency band and performs transmission of a signal of the frequency band between the signal processing circuit and another signal processing circuit. The output circuits of one and another signal processing circuits include circuits having the same configuration. The input circuits of the one and another signal processing circuits include other circuits having the same configurations. The input/output circuits of the one and another signal processing circuits can perform transmission of a signal of the predetermined frequency band even when any one of transmission media having mutually different characteristics is mediated.

17 Claims, 15 Drawing Sheets

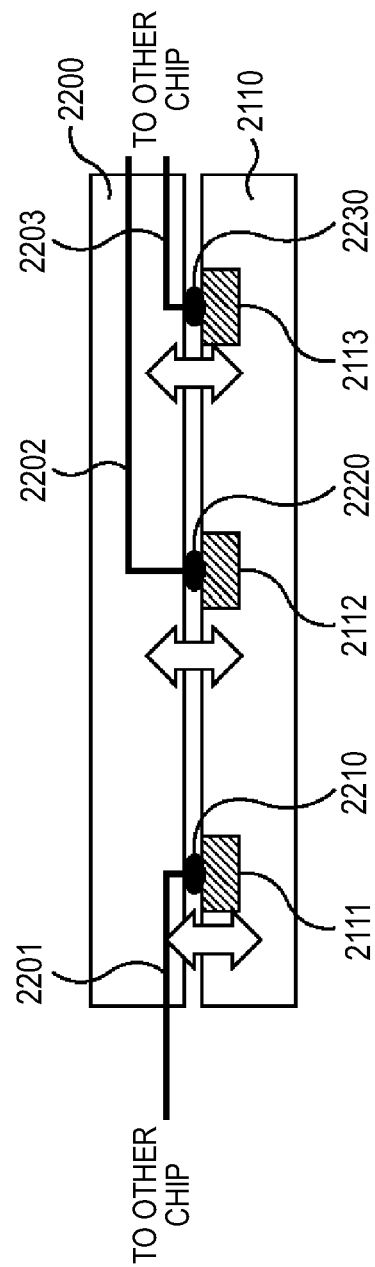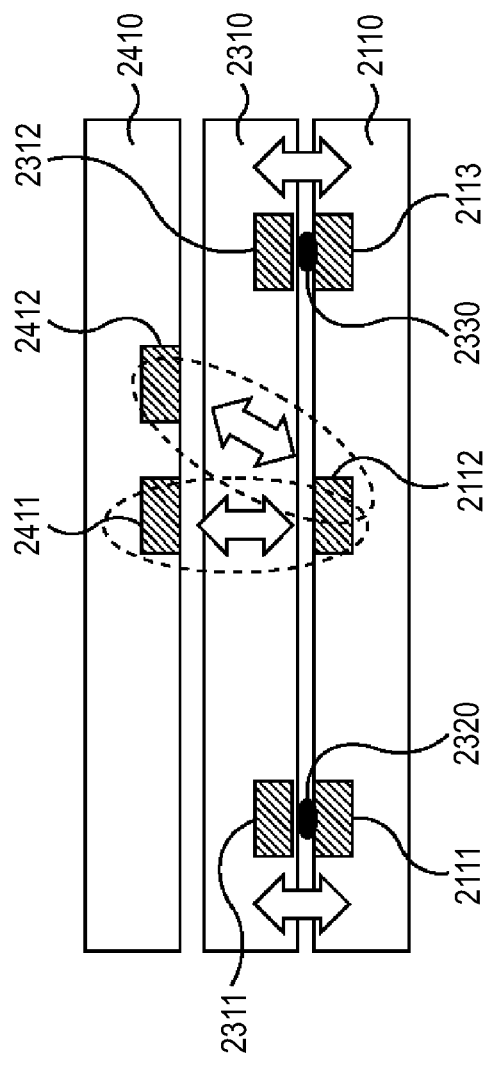

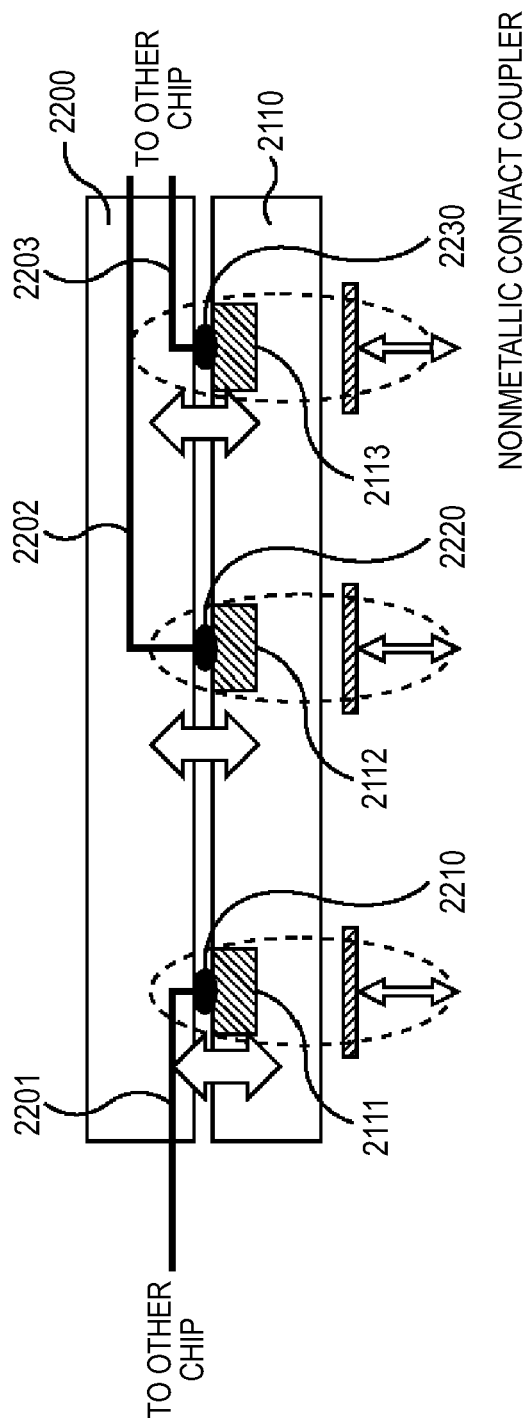

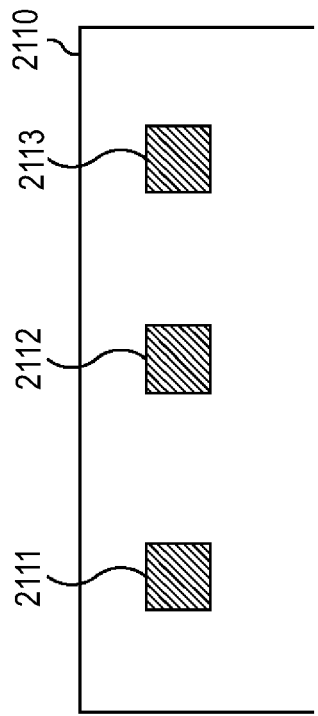
FIG.15
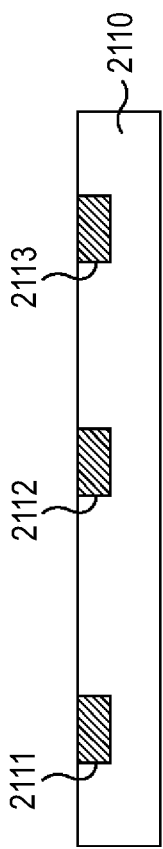

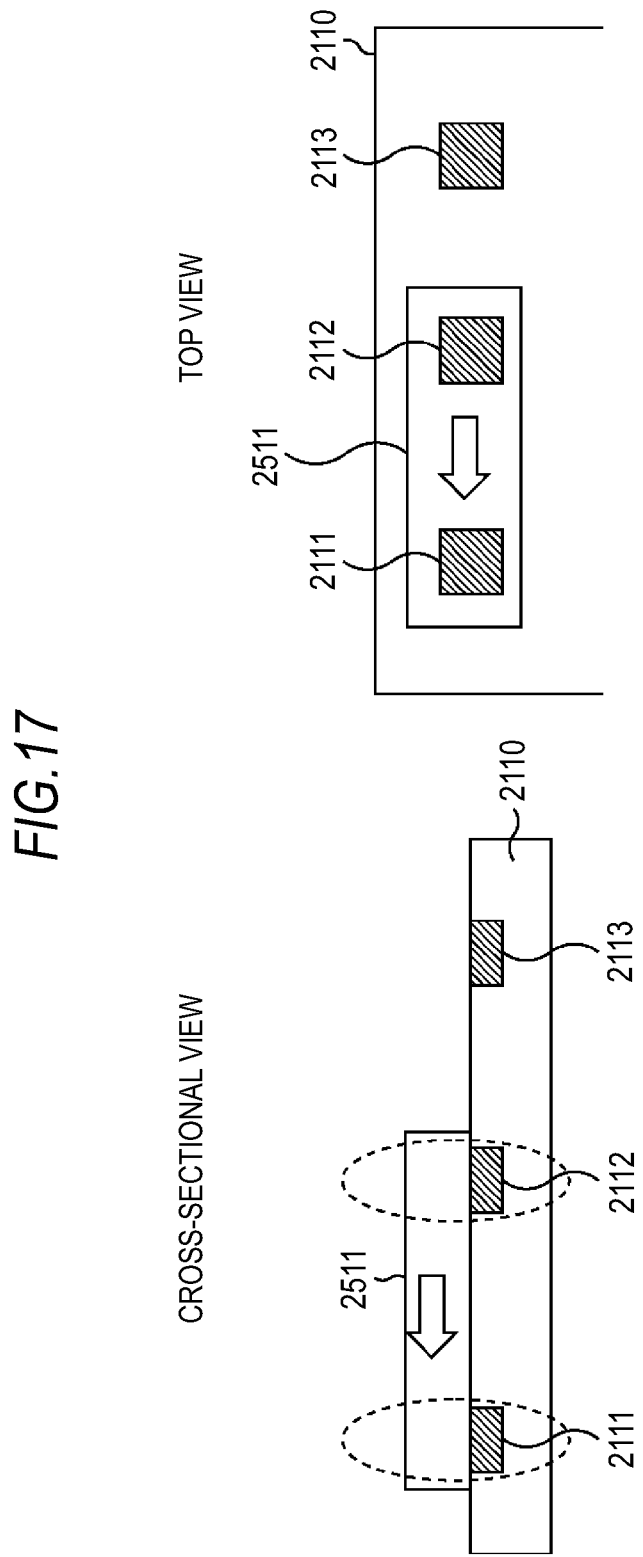

SIGNAL PROCESSING DEVICE

FIELD

The present technology relates to a signal processing device, and more particularly, to a signal processing device capable of reducing the manufacturing cost of, for example, an IC (Integrated Circuit) or the like.

BACKGROUND

In an electronic apparatus, a board on which an IC (including LSI (Large Scale Integration)) is mounted, is housed in a casing.

Recently, ICs have come to be formed as SoCs (System on Chip). According to the SoC, although the versatility is degraded, compared to a case where a series of functions are implemented by using a plurality of general-purpose semiconductor chips, a decrease in the occupant area, an increase in speed, and a decrease in power consumption can be achieved.

In an electronic apparatus, as a transmission medium for data transmission between an IC and another IC mounted on the same board, an IC mounted on a different board, or the like, for example, a metallic line that is a conductive body made of metal or the like is used. Accordingly, in an IC, as an input/output interface used for transmitting and receiving signals to or from an external circuit, an input/output interface that transmits and receives signals through a metallic line is used.

However, in communications (data transmission) through a metallic line, for the wiring of the metallic line, there may be a restriction on the arrangement of an IC on a board or the arrangement of a board in a casing of an electronic apparatus.

Thus, a signal processing device that transmits signals between circuits through wireless communication via free space has been proposed (for example, see JP-A-2003-179821).

According to wireless communication via free space, compared to communication through a metallic line, the degree of freedom of the arrangement of an IC on a board or the arrangement of boards inside a casing of an electronic apparatus can be improved.

SUMMARY

However, in a circuit such as an IC that transmits signals through wireless communication via free space, for example, an input/output interface used for receiving and transmitting signals for example, through wireless communication via free space is used.

Accordingly, for example, for an IC that uses an input/output interface that transmits and receives signals through the metallic line, from the viewpoint of the arrangement of an IC on the board or the like, in a case where there is a demand for transmitting and receiving signals through wireless communication via free space, it is necessary to remake an IC to include an input/output interface, and, as a result, the manufacturing cost of the IC increases.

The remaking of an IC as above may occurs not only in a case where the type of transmission medium is changed such as a case where the transmission medium through which the IC transmits and receives signals is changed from a metallic line to free space, but also in a case where the characteristics of the transmission medium changes.

Thus, it is desirable to reduce the manufacturing cost by preventing remaking a circuit such as an IC.

An embodiment of the present technology is directed to a signal processing device including: a plurality of signal processing circuits. The signal processing circuit includes an input/output circuit that is configured by one or both of an input circuit that serves as an input interface of a signal of a predetermined frequency band and an output circuit that serves as an output interface of a signal of the predetermined frequency band and performs transmission of a signal of the predetermined frequency band between the signal processing circuit and another signal processing circuit, the output circuit of one of the signal processing circuits and the output circuit of another signal processing circuit include circuits having the same configuration, the input circuit of the one signal processing circuit and the input circuit of the another signal processing circuit include other circuits having the same configurations, and the input/output circuit of the one signal processing circuit and the input/output circuit of the another signal processing circuit can perform transmission of a signal of the predetermined frequency band even in a case where any one of a plurality of transmission media having mutually different characteristics is mediated.

In the above-described signal processing device, the signal processing circuit includes an input/output circuit that is configured by one or both of an input circuit that serves as an input interface of a signal of a predetermined frequency band and an output circuit that serves as an output interface of a signal of the predetermined frequency band and performs transmission of a signal of the predetermined frequency band between the signal processing circuit and another signal processing circuit. In addition, the output circuit of one of the signal processing circuits and the output circuit of another signal processing circuit include circuits having the same configuration, the input circuit of the one signal processing circuit and the input circuit of the another signal processing circuit include other circuits having the same configurations, and the input/output circuit of the one signal processing circuit and the input/output circuit of the another signal processing circuit can perform transmission of a signal of the predetermined frequency band even in a case where any one of a plurality of transmission media having mutually different characteristics is mediated.

According to the embodiment of the present technology, the manufacturing cost can be reduced by preventing remaking a circuit.

BRIEF DESCRIPTION OF THE DRAWINGS

FIGS. 13A and 13B are cross-sectional views illustrating the mounting of a chip after a noninvasive test is performed.

FIG. 14 is a cross-sectional view illustrating a method of testing the chip after being mounted.

FIG. 15 is a diagram illustrating a loopback testing method for the chip.

FIG. 17 is a diagram illustrating a loopback testing method for the chip.

DETAILED DESCRIPTION

Input/Output Circuit According to Embodiment of Present Technology

Figure 1:
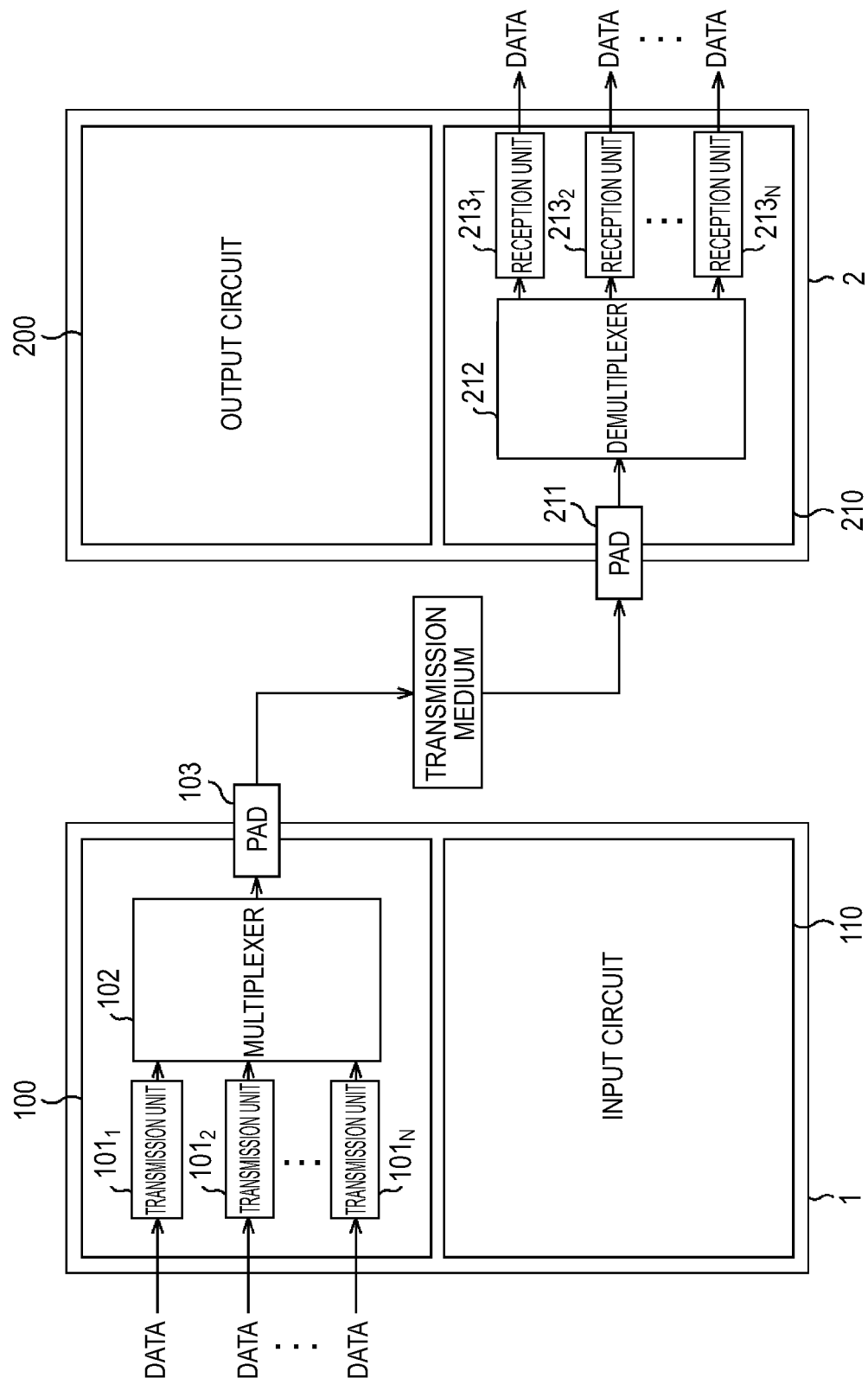
FIG. 1 is a block diagram illustrating a configuration example of an input/output circuit according to an embodiment of the present technology.

FIG. 1 is a block diagram illustrating a configuration example of an input/output circuit according to an embodiment of the present technology.

As illustrated in FIG. 1, each one of the input/output circuits 1 and 2 is configured on a semiconductor chip such as a CMOS (Complementary Metal Oxide Semiconductor). The semiconductor chip serves as an interface to transmit and receive signals to and from an external circuit.

Here, for example, the input/output circuits 1 and 2 are assumed to be configured on different semiconductor chips.

The input/output circuit 1 includes an output circuit 100 and an input circuit 110.

The output circuit 100 includes one or more transmission units $101_1, 101_2, \ldots, 101_N$, a multiplexer 102, and a pad (PAD) 103 and serves as an output interface that outputs a signal of a predetermined frequency band such as a signal of a high frequency band to the outside.

In other words, to the transmission unit $101_1$, a baseband signal, for example, serial data is supplied from a circuit, which is not illustrated in the figure, within the semiconductor chip in which the input/output circuit 1 is configured.

The transmission unit $101_1$ performs a frequency conversion of the serial data as a baseband signal and outputs a signal after the conversion that is a signal of a high frequency band.

Accordingly, the transmission unit $101_1$ serves as a conversion circuit that performs frequency conversion of a baseband signal into a signal after conversion as a signal of the high frequency band.

The signal after the conversion output by the transmission unit $101_1$ is supplied to a multiplexer 102.

The multiplexer 102 composes (multiplexes) signals after conversion output from each one of the transmission unit $101_1$ to $101_N$ and outputs a composed signal.

Here, when the center frequency of the frequency band of the signal after the conversion that is output by the transmission unit $101_1$ is denoted by $fs_i$, the multiplexer 102 can be configured by BPFs (Band Pass Filters) used for limiting the frequency band of the signal after conversion that has the center frequency of the frequency $fs_i$ output by the transmission unit $101_i$ to a predetermined bandwidth and a connection point that connects the connection lines of the outputs of N BPFs that limit each of the frequency bands of signals after conversion that are output by the transmission units $101_1$ to $101_N$.

Now, when a BPF used for limiting the frequency band of a signal after conversion that has a center frequency of a frequency $fs_i$ output by the transmission unit $101_1$ out of the N BPFs configuring the multiplexer 102 is denoted as BPF#i, in the multiplexer 102 that is configured by N BPF#1 to #N and a connection point that connects the connection lines of the outputs of the N BPF#1 to #N, in the BPF#i, the frequency band of the signal after conversion that is output by the transmission unit $101_1$ is limited, and then, the signals after conversion that are output from N BPF#1 to #N are composed at the connection point that connects the connection lines of the outputs of the N BPF#1 to #N.

The composed signal output by the multiplexer 102, that is, a signal acquired by performing frequency multiplexing of signals after conversion that are output by the transmission units $101_1$ to $101_N$ is output from the pad 103 and is transmitted through a predetermined transmission medium.

As above, the serial data acquired from the semiconductor chip in which the input/output circuit 1 is configured is transmitted as a composed signal to another semiconductor chip, for example, a semiconductor chip in which the input/output circuit 2 is configured.

The input circuit 110 is configured similarly to an input circuit 210, which will be described later, of the input/output circuit 2 as another input/output circuit (viewed from the input/output circuit 1).

The input/output circuit 2 includes an output circuit 200 and an input circuit 210.

The output circuit 200 is configured similarly to the output circuit 100 of the input/output circuit 1 as another input/output circuit (viewed from the input/output circuit 2).

The input circuit 210 includes a pad 211, a demultiplexer 212, and one or more reception units $213_1, 213_2, \ldots, 213_N$ and serves as an input interface that receives the input of a signal of a predetermined frequency band such as a signal of a high frequency band.

In other words, to the pad 211, the composed signal transmitted through the predetermined transmission medium is input (supplied), and the composed signal input to the pad 211 is supplied to the demultiplexer 212.

The demultiplexer 212, to each of the reception units $213_1$ to $213_N$, distributes signals after conversion, which are included in the composed signal supplied thereto, that have a target frequency band for which at least the reception unit $213_1$ performs frequency conversion.

Here, as will be described later, although the reception unit $213_i$ performs frequency conversion for converting the signal after conversion into a baseband signal, when the center frequency of the frequency band of a signal after conversion as a frequency target of the reception unit $213_i$ is denoted by $fr_i$, the demultiplexer 212, distributes at least the signal after conversion, of which the center frequency is a frequency $fr_i$, that is included in the composed signal transmitted from the pad 211 to the reception unit $213_i$.

The demultiplexer 212 as above can be configured by a BPF, for example, that is used for extracting a signal after conversion that has a center frequency of a frequency $fr_i$ as a target for which the reception unit $213_i$ performs frequency conversion from the composed signal and a connection point that connects the connection lines of the inputs of N BPFs for the reception units $213_1$ to $213_N$.

Now, out of N BPFs configuring the demultiplexer 212, when a BPF that is used for extracting a signal after conversion that has a center frequency of a frequency $fr_i$ is denoted by BPF' #i, in the demultiplexer 212 that is configured by N BPF' #1 to #N and a connection point that connects the connection lines of each of the inputs of the N BPF' #1 to #N, composed signals are supplied from the connection points that connects each of the input connection lines of N BPF' #1 to #N to each of N BPF' #1 to #N. Then, in BPF' #i, the signal after conversion that has the center frequency of a frequency $fr_i$ is extracted and is supplied (distributed) to the reception unit $213_1$.

In addition, when data transmitted from the input/output circuit 1 is received by the input/output circuit 2, the frequency $fs_i$ of the signal after conversion that is handled by the transmission unit $101_1$ and the frequency $fr_i$ of the signal after conversion that is handled by the reception unit $213_1$ is the same.

The reception unit $213_1$ performs frequency conversion of the signal after conversion that has a center frequency of a frequency $fr_i$ and is transmitted from the demultiplexer 212 and outputs serial data as a baseband signal.

Accordingly, the reception unit $213_1$ serves as an inverse conversion circuit that performs frequency conversion of the signal after conversion that is a signal of a high frequency band into a baseband signal.

The serial data output by the reception unit $213_1$ is supplied to a circuit, which is not illustrated in the figure, within the semiconductor chip in which the input/output circuit 2 is configured.

As above, by the semiconductor chip in which the input/output circuit 2 is configured, the serial data transmitted as a composed signal from another semiconductor chip, for example, the semiconductor chip in which the input/output circuit 1 is configured is received.

In addition, the frequency $fs_i$ of the signal after conversion that is handled by the transmission unit $101_i$ and the frequency $fs_{i'}$ of the signal after conversion that is handled by another transmission unit $101_{i'}$ (i≠i') are different from each other. This similarly applies to the frequency $fr_i$ of the signal after conversion that is handled by the reception unit $213_i$.

In addition, the input/output circuit 1 can be configured by only the output circuit 100 or the input circuit 110. Similarly, the input circuit 2 may be configured by only the output circuit 200 or the input circuit 210.

For example, in a case where only data transmission is performed from the semiconductor chip in which the input/output circuit 1 is configured to the semiconductor chip in which the input/output circuit 2 is configured, the input/output circuit 1 can be configured by only the output circuit 100, and the input circuit 2 can be configured by only the input circuit 210.

In addition, in a case where only one transmission unit $101_1$ is disposed in the output circuit 100, the output circuit 100 can be configured without arranging the multiplexer 102. Similarly, in a case where only one reception unit $213_1$ is disposed in the input circuit 210, the input circuit 210 can be configured without arranging the demultiplexer 212. The number N of the transmission units $101_1$ to $101_N$ disposed in the output circuit 100 and the number N of the reception units $213_1$ to $213_N$ disposed in the input circuit 210 are set such that data transmission can be performed at the data rate, for example, based on the data rate and the like of the data transmitted from the output circuit 100 to the input circuit 210.

Here, since the input circuit 110 of the input/output circuit 1 and the input circuit 210 of the input/output circuit 2 are similarly configured, the input circuit 110 includes the pad (not illustrated in the figure) that is similar to the pad 211 included in the input circuit 210. In the input/output circuit 1, the pad 103 included in the output circuit 100 and a pad, which is not illustrated in the figure, included in the input circuit 110 can be served by one pad. This applies the same to the input/output circuit 2.

Configuration Example of Transmission Unit $101_i$

Figure 2:
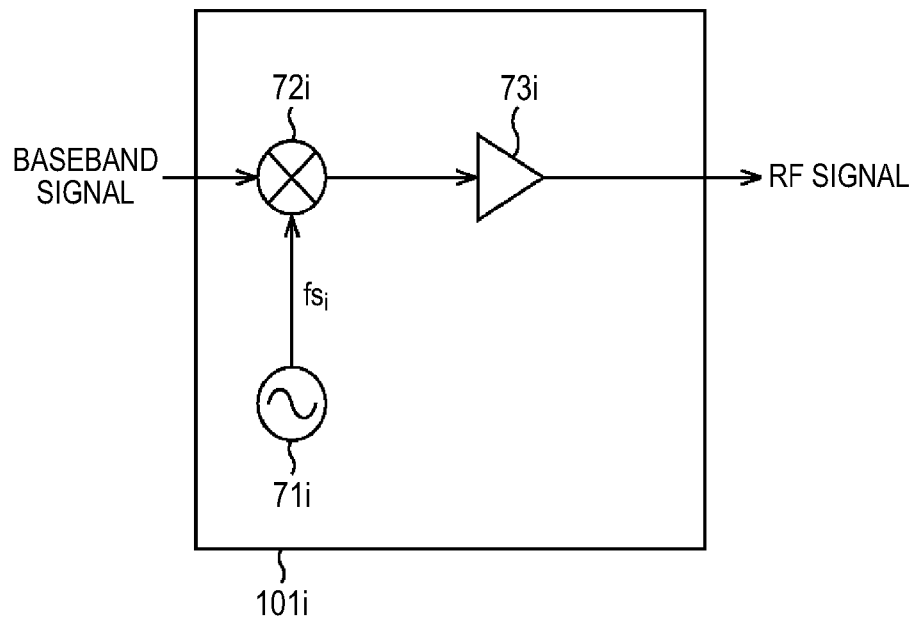
FIG. 2 is a block diagram illustrating a configuration example of a transmission unit.

FIG. 2 is a block diagram illustrating a configuration example of the transmission unit $101_i$ illustrated in FIG. 1.

The transmission unit $101_i$, for example, performs frequency conversion (up converter) of, for example, a baseband signal into a signal of a milli-wave zone.

Here, a signal of the milli-wave zone is a signal having a frequency of about 30 to 300 GHz, that is, having a waveform of about 1 to 10 mm. According to the signal of the milli-wave zone, the frequency is high, and accordingly, data transmission can be performed at a high rate, and, in a case where transmission and reception are performed in a wireless manner, for example, a bonding wire of about 1 mm can be used as an antenna.

The transmission unit $101_i$ includes an oscillator $71j$, a mixer $72_i$, and an amplifier $73_i$.

The oscillator $71i$, for example, generates a carrier of a milli-wave zone through oscillation and supplies the carrier to the mixer $72i$.

The center frequency $fs_i$ of the signal after conversion that is output by the transmission unit $101_i$ corresponds to the frequency of the carrier that is generated by the oscillator $71_i$ included in the transmission unit $101_i$.

To the mixer $72_i$, the carrier is supplied from the oscillator $71_i$, and serial data that is a baseband signal is supplied.

Here, when the data rate of the serial data supplied to the mixer $72_i$, for example, about 2.5 to 5.0 Gbps, in order to reduce the interference between signals after conversion that are acquired through the frequency conversion of the serial data that is performed in each fo the transmission units 1011 to 101N and allow the signals after conversion to be separated from the composed signal acquired by composing the signals after conversion, it is preferable that the frequency of the carrier generated by the oscillator $71_i$, for example, is 30 GHz or higher.

The mixer $72_i$ performs mixing (multiplication) of the serial data and the carrier transmitted from the oscillator $71_i$, the carrier transmitted from the oscillator $71_i$ is modulated in accordance with the serial data, frequency conversion of a modulation signal acquired as a result thereof, that is the serial data as a baseband signal into an RF (Radio Frequency) signal of the frequency band corresponding to the carrier transmitted from the oscillator $71_i$, and then a resultant signal is supplied to the amplifier $73_i$.

The amplifier $73_i$ amplifies the RF signal as a signal after conversion that is transmitted from the mixer $72_i$ and outputs an RF signal as an amplified signal after conversion.

The signal after conversion that is output by the amplifier $73_i$ is supplied to the multiplexor 102 (FIG. 1).

Configuration Example of Reception Unit $213_i$

Figure 3:
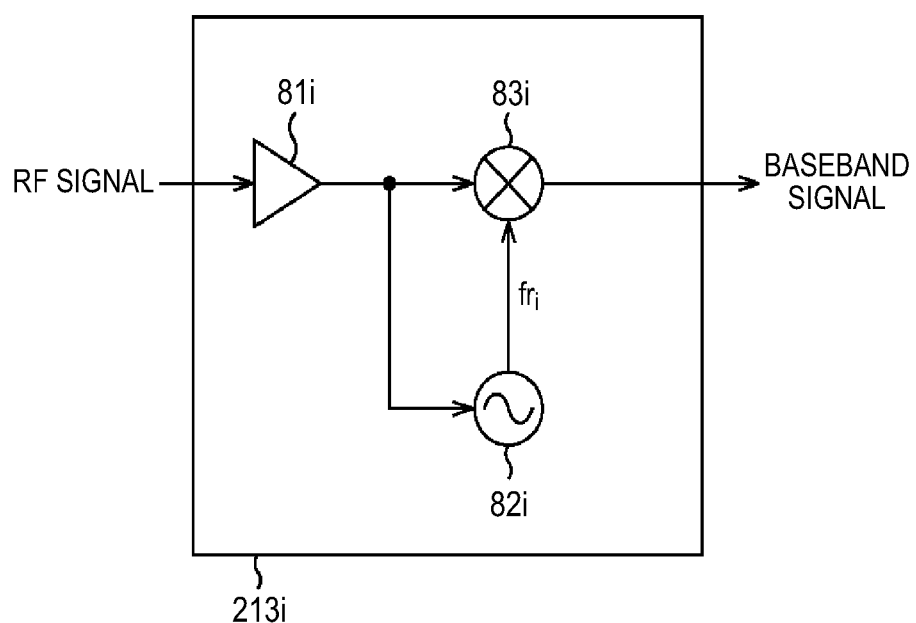
FIG. 3 is a block diagram illustrating a configuration example of a reception unit.

FIG. 3 is a block diagram illustrating a configuration example of the reception unit $213_i$ illustrated in FIG. 1.

The reception unit $213_i$, for example, performs frequency conversion for inverse conversion (down converter) of milli-wave zone into a baseband signal.

The reception unit $213_i$ includes an amplifier $81_i$, an oscillator $82_i$, and a mixer $83_i$.

To the amplifier $81_i$, from the demultiplexer 212 (FIG. 1), an RF signal that at least includes a signal after conversion that has a target frequency band of the reception unit $213_i$ is supplied.

The amplifier $81_i$ amplifies the RF signal supplied thereto and supplies an RF signal that is acquired through amplification as a signal after conversion that has a frequency band that is the target of the reception unit $213_i$ for frequency conversion to the oscillator $82_i$ and the mixer $83_i$.

The oscillator $82_i$, for example, is operated in accordance with the signal (RF signal) after conversion that is transmitted from the amplifier $81_i$ as an injecting signal and generates a reproduction carrier synchronized to the signal (the carrier thereof) after conversion as the injecting signal, that is, a reproduction carrier corresponding to the carrier used for the frequency conversion into the signal after conversion through oscillation and supplies the reproduction carrier to the mixer $83_i$.

The mixer $83_i$ demodulates the signal (modulated signal) after conversion by performing mixing (multiplying) of the signal after conversion transmitted from the amplifier $81_i$ and the reproduction carrier transmitted from the oscillator $82_i$ and outputs a demodulated signal acquired as a result thereof, that is, the serial data acquired by performing frequency conversion of the signal after conversion into a baseband signal.

In the reception unit $213_i$ illustrated in FIG. 3, for the detection of an RF signal, synchronized detection in which the RF signal and the reproduction carrier are multiplied together is used, for the generation of reproduction carrier used for synchronization detection, injecting synchronization in which the RF signal is used as an injection signal is used, and the frequency conversion for converting the signal after conversion into a baseband signal is performed. However, as a frequency converting method used in the reception unit $213_i$, a method in which the detection of an RF signal is performed through square law detection, a method in which the detection of an RF signal is performed through synchronization detection, and a PLL (Phase Lock Loop) is used for generating a reproduction carrier used for the synchronization detection, or the like can be used.

Configuration Example of Amplifiers $73_i$ and $81_i$

Figure 4:
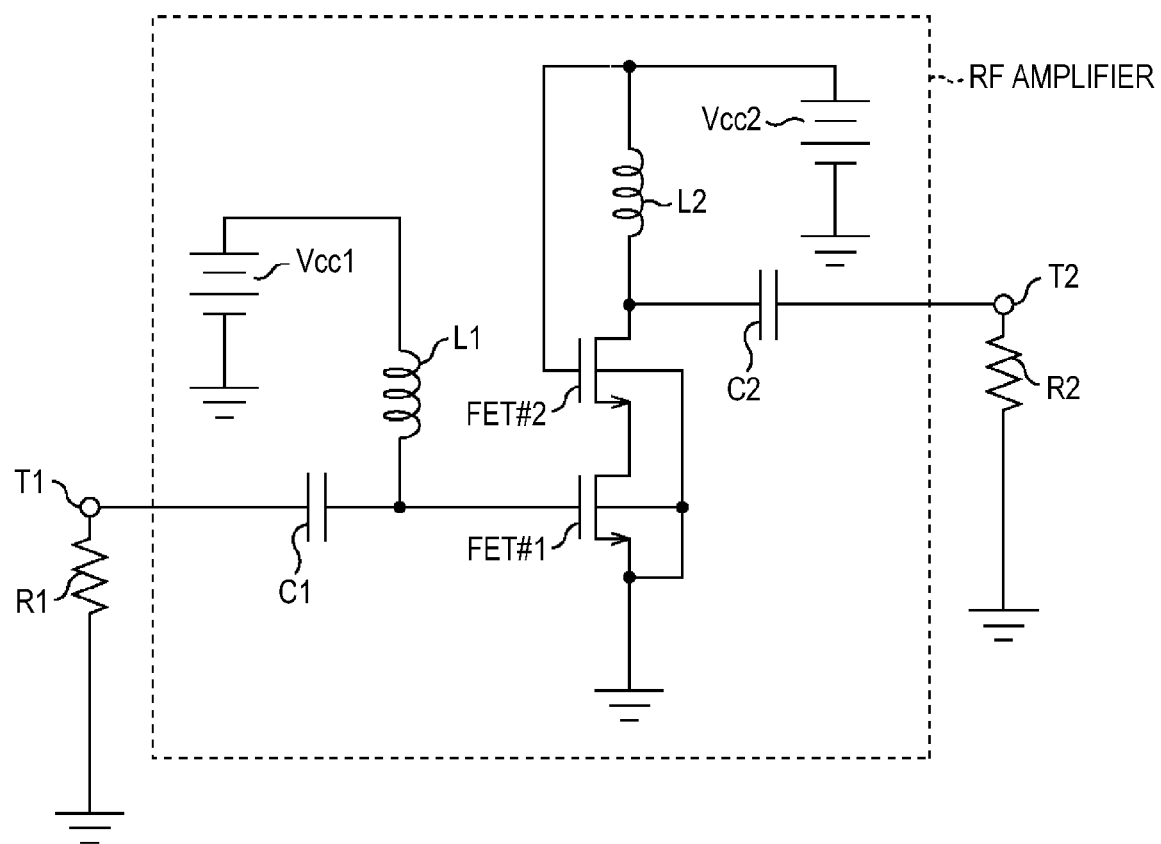
FIG. 4 is a circuit diagram illustrating a configuration example of an RF amplifier that can be used as an amplifier $73_i$ and an amplifier $81_j$.

FIG. 4 is a circuit diagram illustrating a configuration example of an RF amplifier that can be used as an amplifier $73_i$ illustrated in FIG. 2 and an amplifier $81_i$ illustrated in FIG. 3.

Since the amplifiers $73_i$ and $81_i$ are RF amplifiers that amplify an RF signal, they may be similarly configured.

As illustrated in FIG. 4, one end of a capacitor C1 is connected to the input terminal T1 of the RF amplifier, and the other end of the capacitor C1 is connected to one end of a coil L1. In addition, the other end of the coil L1 is connected to a positive terminal of a DC power supply Vcc1 of which a negative terminal is grounded.

A connection point of the capacitor C1 and the coil L1 is connected to the gate of the FET (MOS FET) #1 having the source that is grounded.

The drain of the FET#1 is connected to the source of the FET (MOS FET)#2, and the gate and the drain of the feet#2 are connected to one end and the other end of the coil L2 respectively.

In addition, the substrates of the FET#1 and #2 are grounded.

A connection point of the gate of the FET#2 and the coil L2 is connected to the positive terminal of a DC power supply Vcc2 having a negative terminal that is grounded.

A connection point of the drain of FET#2 and the coil L2 is connected to one end of the capacitor C2, and the other end of the capacitor C2 is connected to the output terminal T2 of the RF amplifier.

The RF amplifier illustrated in FIG. 4 can be used through cascade connection, and each one of the amplifier $73_i$ and $81_i$ can be configured by using only one RF amplifier illustrated in FIG. 4 or by cascade connection of a plurality of the RF amplifiers illustrated in FIG. 4 as needed.

In addition, in a case where the amplifier $73_i$ or $81_i$ is configured by using only one RF amplifier illustrated in FIG. 4, the other ends of resistors R1 and R2 each having grounded one end are connected to an input terminal T1 and an output terminal T2.

Hereinafter, for simplification of the description, it is assumed that each one of the amplifiers $73_i$ and $81_i$ is configured by only one RF amplifier illustrated in FIG. 4.

Since the amplifiers $73_i$ and $81_i$ amplify an RF signal of a milli-wave zone as a signal having a high frequency, as loads of the input side or the output side of the RF amplifier as the amplifiers $73_i$ and $81_j$, inductors can be used.

For the milli-wave zone, as the inductor, a small inductance coil can be used, and such a coil can be easily configured on a CMOS.

In the RF amplifier illustrated in FIG. 4, a coil L1 is an input-side inductor, and a coil L2 is an output-side inductor.

In a case where an inductor is used as the input-side load of the RF amplifier, the frequency characteristics of the input side of the RF amplifier have band-pass filter type characteristics as those of the BPF, and a signal of a part of the frequency band can be separated from the RF signal input (supplied) to the RF amplifier and be amplified.

In addition, in a case where an inductor is used as the output-side load of the RF amplifier, the frequency characteristics of the output side of the RF amplifier have band-pass filter type characteristics as those of the BPF, and the frequency band of the RF signal output from the RF amplifier can be limited.

As above, by using the RF amplifier of which the input-side load or the output-side load is a inductor as the amplifiers $73_i$ and $81_i$, the frequency characteristics of the input-side or the output-side have the characteristics of the band-pass filter type. Accordingly, the multiplexor 102 of the output circuit 100 or the demultiplexer 212 of the input circuit 210 can be configured by using a connection point that connects connection lines without using the BPF described in FIG. 1.

In addition, for the RF amplifier as the amplifier $73_i$ of the transmission unit $101_i$ that is connected to the multiplexer 102 by configuring at least the frequency characteristics of the output side of the RF amplifier out of the input side and the output side as the characteristics of the band-pass filter type, the multiplexor 102 can be configured without using a BPF.

Accordingly, for the RF amplifier as the amplifier $73_i$ of the transmission unit $101_i$ that is connected to the multiplexer 102, as the input-side load, a load other than the inductor can be used, in other words, a resistor can be used instead of the coil L1.

In addition, for the RF amplifier as the amplifier $81_i$ of the reception unit $213_i$ that is connected to the demultiplexer 212 by configuring at least the frequency characteristics of the input side of the RF amplifier out of the input side and the output side as the characteristics of the band-pass filter type, the demultiplexer 212 can be configured without using a BPF.

Accordingly, for the RF amplifier as the amplifier $81_1$ of the reception unit $213_1$ that is connected to the demultiplexer 212, as the output-side load, a load other than the inductor can be used, in other words, a resistor can be used instead of the coil L2.

However, in a case where a gain equal to or higher than a specific level is necessary for the RF amplifier as the amplifier $81_1$ of the reception unit $213i$, it is preferable that an inductor other than a resistor is used as the output-side load.

As above, by configuring the multiplexor 102 and the demultiplexer 212 without using a BPF, the output circuit 100 and the input circuit 210, and the input/output circuits 1 and 2 can be configured so as to have small sizes.

Figure 5:
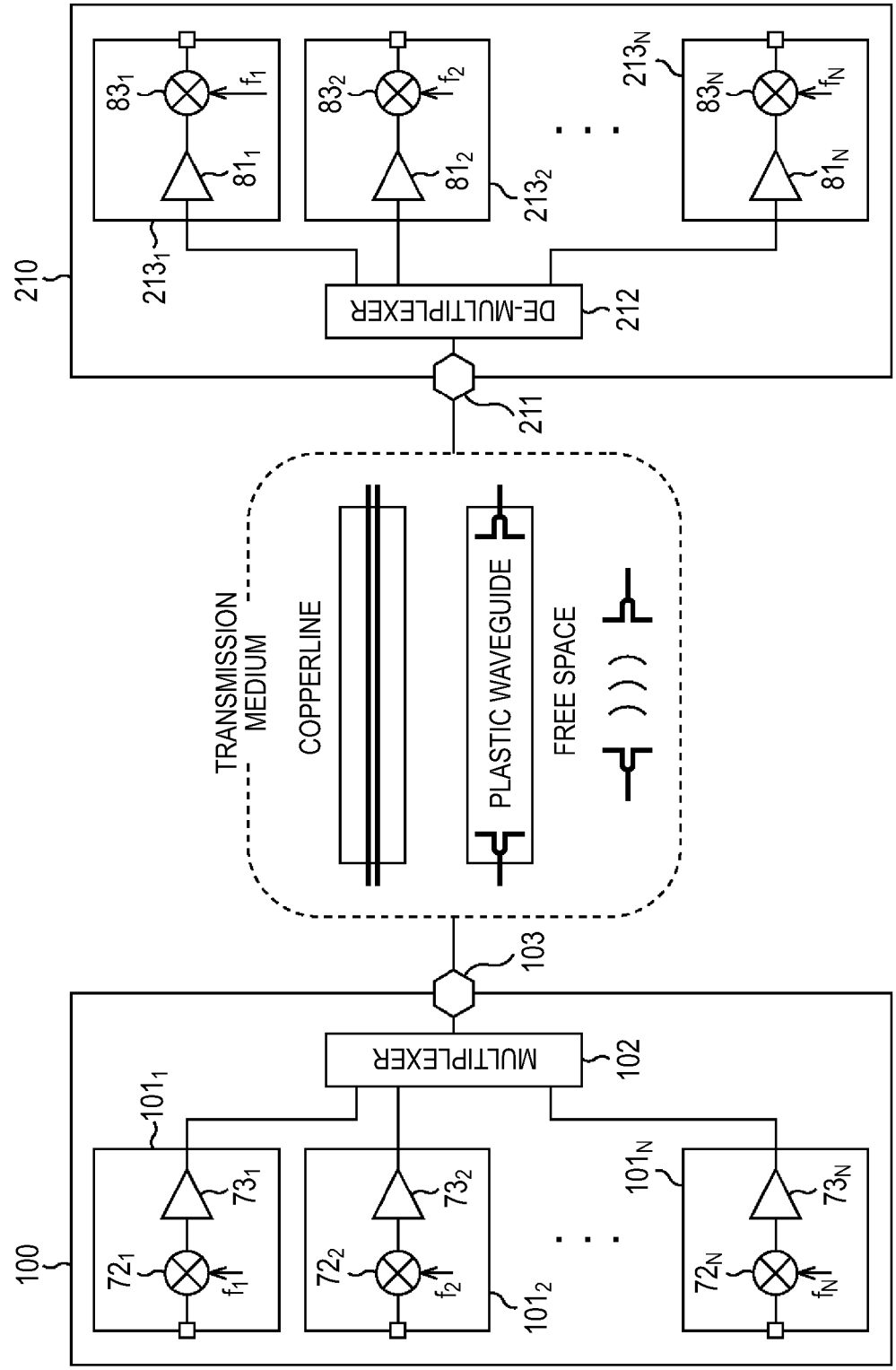
FIG. 5 is a diagram illustrating a transmission medium that can be used by input/output circuits 1 and 2 for data transmission.

Transmission Medium Used by Input/Output Circuits 1 and 2 for Data Transmission FIG. 5 is a diagram illustrating a transmission medium that can be used by the input/output circuits 1 and 2, which are illustrated in FIG. 1, for data transmission (for example, data transmission from the output circuit 100 of the input/output circuit 1 to the input circuit 210 of the input/output circuit 2).

Between the input/output circuits 1 and 2, for example, a signal after conversion in the milli-wave zone is used (used as mediation), and accordingly, data transmission can be performed through transmission media having different characteristics (transmission characteristics) without remaking the input/output circuits 1 and 2.

More specifically, for example, while transmission media of different types including a metallic line (copper line) such as a copper line, a dielectric waveguide such as a plastic waveguide, a free space, and the like have mutually different transmission characteristics, data transmission can be performed by mediating anyone of the transmission media having different transmission characteristics between the input/output circuits 1 and 2.

In addition, even transmission media of the same type may have mutually different transmission characteristics. The transmission media having different transmission characteristics may be any one of transmission media having mutually different transmission characteristics due to the difference in type and the transmission media of the same type having mutually different transmission characteristics.

Here, for example, while a coplanar strip line is a transmission medium of a metallic line and is a balanced transmission line (a transmission line in which differential signals are exchanged) that is configured by two strip-shaped conductors arranged to be parallel to each other, for example a coplanar strip line in which parts of two strip-shaped conductors are cut out and a coplanar strip line in which two strip-shaped conductors are not cut off but are continuous correspond to the transmission media of the same kind that have mutually different transmission characteristics.

Figure 6:
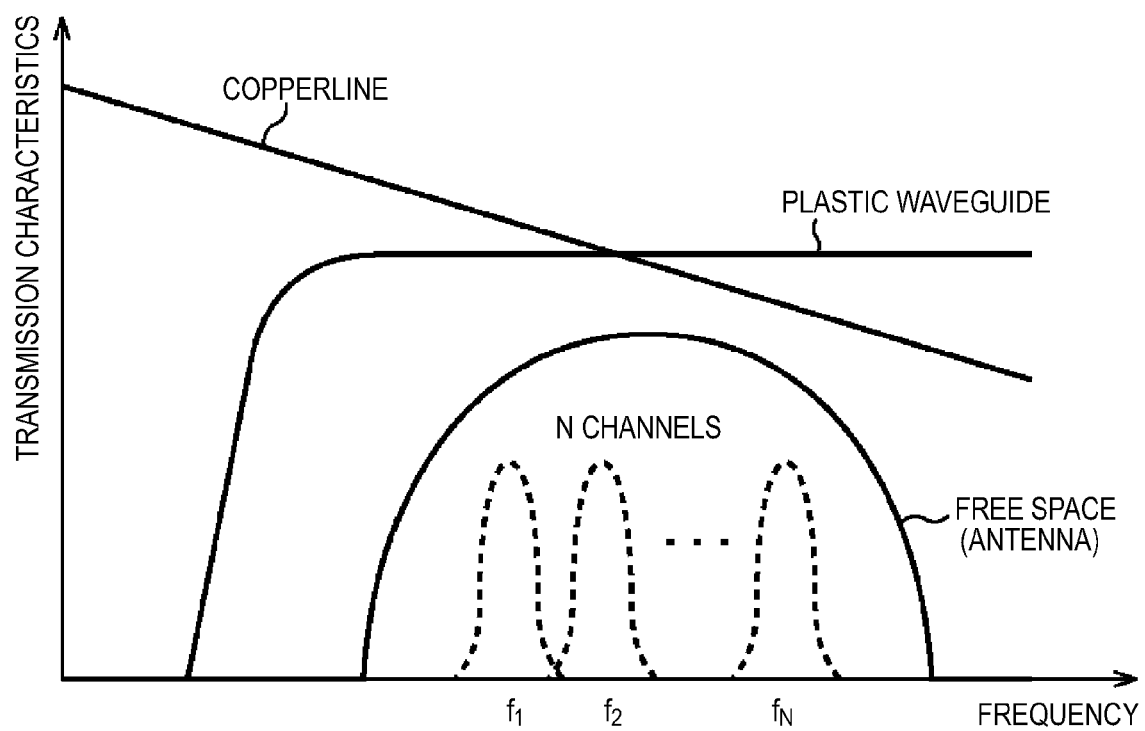
FIG. 6 is a diagram illustrating the transmission characteristics of a metallic line (copper line), a dielectric waveguide (plastic waveguide), and a free space.

FIG. 6 is a diagram illustrating the transmission characteristics of a metallic line (copper line), a dielectric waveguide (plastic waveguide), and a free space.

In addition, as the metallic lines, for example, coplanar strip lines in which the length from one end to the other end of each of two strip-shaped conductors is about 25 mm can be used. As the dielectric waveguide, for example, a plastic waveguide of which the length from one end to the other end is about 120 mm and the width is about 2 mm can be used. As the free space, for example, a space (in the air) of about 5 mm can be used.

FIG. 6 is a diagram schematically illustrating the transmission characteristics (amplitude characteristics) of the metallic line, the dielectric waveguide, and the free space described above.

The metallic line have the transmission characteristics that are the same as those of an LPF (Low Pass Filter), the dielectric waveguide have the transmission characteristics that are the same as those of an HPF (High Pass Filter), and the free space have the same transmission characteristics that are the same as those of a BPF.

All the transmission characteristics of the metallic line, the dielectric waveguide, and the free space as the transmission media used for data transmission between the input/output circuits 1 and 2 are characteristics for passing a frequency band, for example, of about 40 GHz to 100 GHz as the frequency band of the milli-wave zone used between data transmission between the input/output circuits 1 and 2.

In a case where data transmission is performed between the input/output circuits 1 and 2, as described with reference to FIG. 1, although the frequency $fs_i$ of the signal after conversion that is handled by the transmission unit $101_i$ and the frequency $fr_i$ of the signal after conversion that is handled by the reception unit $213_i$ are the same, when the same frequency is denoted by $f_i$ ($=fs_i=fr_i$), and $f_1, f_2, \ldots, f_N$ satisfy the condition of $f_1 < f_2 < \ldots < f_N$, as the frequency $f_1$, for example, a frequency higher than 30 GHz is used, and as the frequency $f_N$, for example, a frequency lower than 300 GHz is used.

Since data transmission can be performed between the input/output circuits 1 and 2 through a transmission medium having different characteristics (transmission characteristics), even in a case where the transmission medium used for transmission between the input/output circuits 1 and 2 is changed, it is not necessary to remake a semiconductor chip in which the input/output circuit 1 or 2 is configured, and, as a result, the manufacturing cost of the semiconductor chip (furthermore, an electronic device as a signal processing device using such a semiconductor chip) can be reduced.

In addition, the output circuit 100 of the input/output circuit 1 and the output circuit 200 of the input/output circuit 2 include the transmission units $101_i$ as circuits having the same configuration. In addition, the input circuit 110 of the input/output circuit 1 and the input circuit 210 of the input/output circuit 2 include circuits having the reception units $213_i$ as other circuits having the same configuration. In addition, as illustrated in FIG. 1, the output circuit 100 of the input/output circuit 1 and the output circuit 200 of the input/output circuit 2 have the same configuration, and the input circuit 110 of the input/output circuit 1 and input circuit 210 of the input/output circuit 2 have the same configuration.

As above, the input/output circuits 1 and 2 are similarly configured, and it is not necessary to change the configuration used for data transmission for each transmission medium, and the mass production thereof can be performed in an easy manner.

In addition, in a case where a dielectric wave guide or a free space is used as the transmission medium used for data transmission between the input/output circuits 1 and 2, an antenna used for efficiently radiating an RF signal of the milli-wave zone into the dielectric wave guide or the free space may be connected to the pads 103 and 211 as couplers that are connectors with the transmission medium. In such an antenna, for example, a bonding wire having a length of ½ (or more) of the wavelength λ in the milli-wave zone or a coil (loop antenna) can be used.

In addition, as the transmission unit $101_i$ that outputs a signal of the milli-wave zone, the circuit of a part of the output circuit 100 that outputs an RF signal, the reception unit $213_1$ that receives the input of a signal of the milli-wave zone, and the circuit of a part of the input circuit 210 that receives an RF signal of the input circuit 210, a single-end I/F that can exchange single-ended signals is expected to be used due to easy measurement of an RF signal of a signal of the milli-wave zone through the pads 103 and 211 (a probe of the measuring device that measures a signal of the milli-wave zone corresponds to a signal ended signal), a simple circuit configuration of the circuit mounted on the CMOS chip, and low power consumption.

On the other hand, for example, a coplanar strip line as a transmission medium of the metallic line is a balanced transmission line (a differential transmission line) that can exchange a differential signal.

Accordingly, in a case where coplanar strip line is used as a transmission medium between the output circuit 100 and the input circuit 210 that employ the single end I/F, it is necessary to connect a circuit called Balun that performs conversion (balance-unbalanced (non-balanced) conversion) between a single ended signal and a differential signal to the pads 103 and 211.

However, in a case where the Balun is connected to the pads 103 and 211, the size of an electronic device that is configured by using semiconductor chips using the input/output circuits 1 or 2 is increased, and the manufacturing cost thereof increases.

Thus, in a case where a coplanar strip line that is a differential transmission line is used as a transmission medium, it may be configured such that the pad 103 (211) at which signal components are exchanged is electrically and directly connected to one conductor out of two conductors that configure the coplanar strip line, and a ground (GND), which is not illustrated in the figure, of the output circuit 100 (input circuit 210) is directly connected to the other conductor.

In such a case, a signal of the milli-wave zone that is a single ended signal output from the pad 103 of the output circuit 100 is transmitted as a differential signal (to the input circuit 210) in the coplanar strip line.

In data transmission using a single ended signal, compared to the data transmission using a differential signal, there are much unnecessary radiation, and the resistance to a noise transmitted from the outside (outside the transmission line through which the single ended signal is transmitted) is weak, whereby the quality of data transmission may deteriorate. However, by transmitting the single-ended signal as a differential signal, data transmission having a high quality can be performed.

In addition, generally, the impedance of a differential transmission line is higher than that of the single-ended I/F, and, in a case where the impedance of the differential transmission line and the impedance of the signal-ended I/F are greatly different from each other, data transmission having high quality may be blocked due to reflection that is caused by impedance mismatching.

Accordingly, in a case where the coplanar strip line as a differential transmission line is used as the transmission medium, by arranging a dielectric body, the impedance (characteristics impedance) of the coplanar strip line is decreased so as to achieve impedance matching.

In other words, the characteristic impedance of the coplanar strip line as a differential transmission line decreases by decreasing the capacitance. Thus, by arranging a dielectric on the coplanar strip line that is a differential transmission line, the capacitance of the coplanar strip line and furthermore the characteristics impedance thereof can be decreased.

Furthermore, in a case where the coplanar strip line that is a differential transmission line is used as a transmission medium, a short stub having a length of about $\lambda/4$ may be connected to a conductor that is connected to the pad 103 (211) at which signal components are exchanged out of two conductors configuring the coplanar strip line.

Since the short stub serves as a BPF, a low-frequency noise can be eliminated, and a common mode noise on the coplanar strip line is reduced, whereby the transmission characteristic of the differential mode (normal mode) can be improved.

Figure 7:
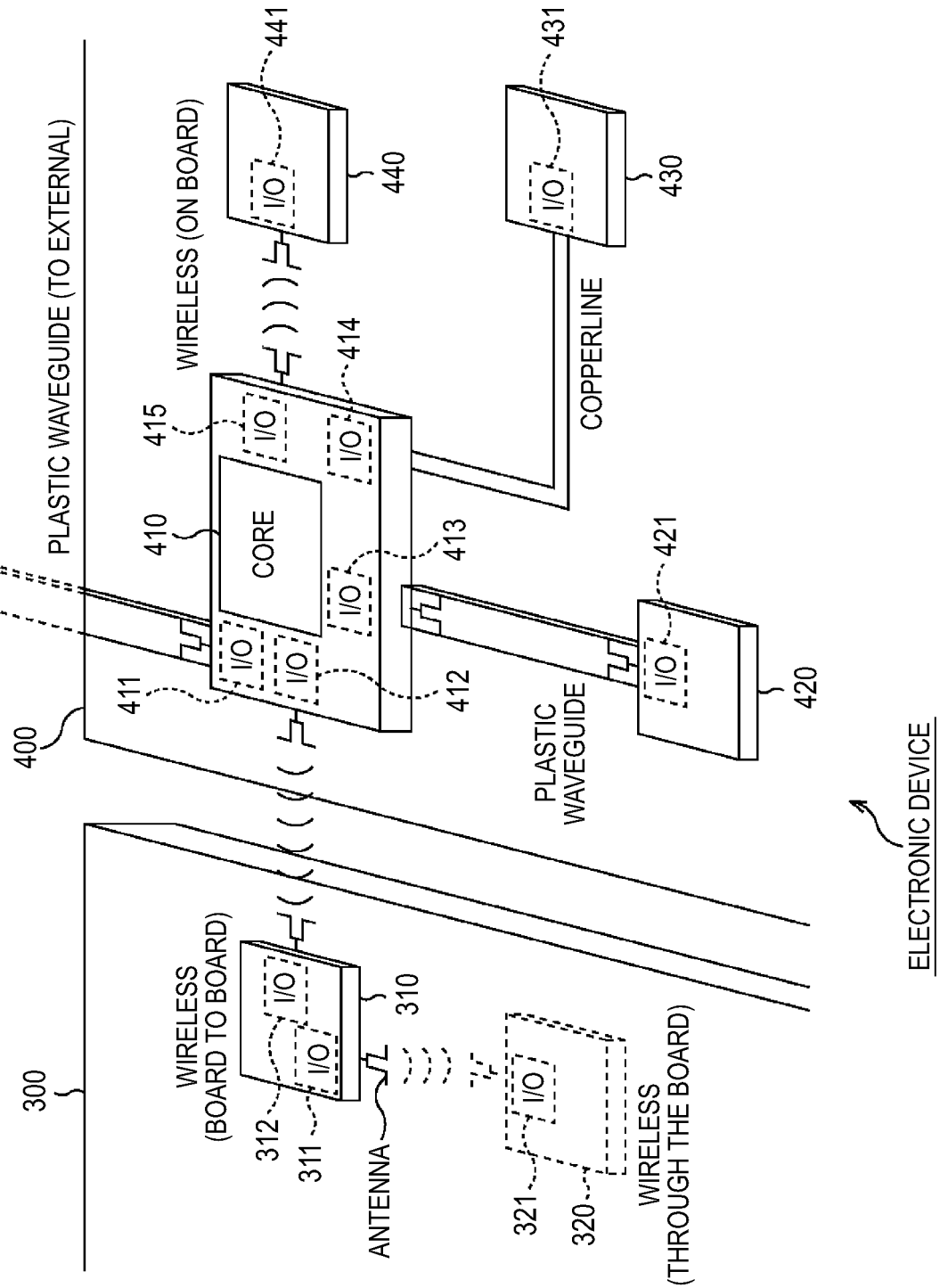
FIG. 7 is a perspective view illustrating a configuration example of an electronic device according to an embodiment of the present technology as a signal processing device.

Configuration Example of Electronic Device According to Embodiment of Present Technology FIG. 7 is a perspective view illustrating a configuration example of an electronic device according to an embodiment of the present technology as a signal processing device.

The electronic device is configured by a plurality of boards, and the plurality of boards are housed in a casing of the electronic device. FIG. 7 illustrates two boards 300 and 400 out of a plurality of boards housed inside the casing of the electronic device.

The boards 300 and 400 are flat plate-shaped printed board, and are arranged so as to be aligned on one plane.

On the front face as one face of the board 300, a semiconductor chip (hereinafter, simply referred to as a chip) 310 as a signal processing circuit is mounted, and, on the rear face opposite to the front face, as denoted by a dotted line in the figure, a chip 320 is mounted.

The chip 310 includes (incorporates) input/output circuits (I/O) 311 and 312, and the chip 320 include an input/output circuit 321.

On the front face as one face of the board 400, chips 410, 420, 430, and 440 are mounted.

The chip 410 includes input/output circuits 411, 412, 413, 414, and 415, and the chip 420 includes an input/output circuit 421, the chip 430 includes an input/output circuit 431, and the chip 440 includes an input/output circuit 441.

As above, as illustrated in FIG. 7, the electronic device as a signal processing device includes six (or more) chips 310, 320, and 410 to 440 as a plurality of signal processing circuits.

The input/output circuits 311, 312, 321, 411 to 415, 421, 431, and, 441 are configured similarly to the input/output circuit 1 (FIG. 1). Accordingly, the input/output circuits 311, 312, 321, 411 to 415, 421, 431, and, 441 can perform data transmission in a case where any one of a plurality of transmission media having different characteristics such as a metallic line, a dielectric waveguide, a free space, or the like is mediated between the corresponding input/output circuit and another input/output circuit.

As illustrated in FIG. 7, an antenna used for exchanging electric waves through a free space is connected to a portion of the input/output circuit 311 of the chip 310 mounted on the front face of the board 300 and the input/output circuit 321 of the chip 320 mounted on the rear face of the board 300, which corresponds to the pad 103 or 211 illustrated in FIG. 1.

Accordingly, the input/output circuits 311 and 321 perform data transmission through a free space (wireless) (when the board 300 is regarded as a dielectric waveguide, the board 300 as the dielectric waveguide).

In addition, as illustrated in FIG. 7, an antenna used for exchanging electric waves through a free space is connected to a portion of the input/output circuit 312 of the chip 310 mounted on the board 300 and the input/output circuit 412 of the chip 410 mounted on the other board 400 (a board other than the board 300), which corresponds to the pad 103 or 211 illustrated in FIG. 1.

Accordingly, the input/output circuits 312 and 412 perform data transmission through a free space (wireless).

In addition, as illustrated in FIG. 7, to a portion of the input/output circuit 411 of the chip 410 mounted on the board 400 which corresponds to the pad 103 or 211 illustrated in FIG. 1, an antenna used for exchanging a signal of the milli-wave zone as RF signals through a dielectric waveguide such as a plastic waveguide with high efficiency is connected.

In addition, a stripe-shaped plastic waveguide connected to an external circuit not illustrated in the figure and not on the board 400 (or the board 300) is arranged such that one end is brought into contact with the antenna connected to the input/output circuit 411.

Accordingly, between the input/output circuit 411 of the chip 410 mounted on the board 400 and an external circuit not illustrated in the figure, data transmission is performed through a plastic waveguide as a dielectric waveguide.

In addition, as illustrated in FIG. 7, to portions of the input/output circuit 413 of the chip 410 mounted on the board 400 and the input/output circuit 421 of the chip 420 mounted on the board 400, which corresponds to the pad 103 or 211 illustrated in FIG. 1, an antenna used for exchanging electric waves of the milli-wave zone as RF signals through a dielectric waveguide such as a plastic waveguide with high efficiency is connected.

Then, a stripe-shaped plastic wave guide is arranged such that one end is brought into contact with the antenna connected to the input/output circuit 413, and the other end is brought into contact with the antenna connected to the input/output circuit 421.

Accordingly, the input/output circuits 413 and 421 perform data transmission through the plastic waveguide as a dielectric waveguide.

Furthermore, as illustrated in FIG. 7, to portions of the input/output circuit 414 of the chip 410 mounted on the board 400 and the input/output circuit 431 of the chip 430 mounted on the board 400, which correspond to the pad 103 or 211 illustrated in FIG. 1, one end and the other end of the metallic line (copper line) such as a coplanar strip line are connected.

Accordingly, the input/output circuits 414 and 431 perform data transmission through the metallic line (copper line) such as a coplanar strip line.

In addition, as illustrated in FIG. 7, an antenna used for exchanging electric waves through a free space is connected to portions of the input/output circuit 415 of the chip 410 mounted on the board 400 and the input/output circuit 441 of the chip 440 mounted on the board 400, which correspond to the pad 103 or 211 illustrated in FIG. 1.

Accordingly, the input/output circuits 415 and 441 perform data transmission through a free space (wireless).

Although the data transmission through the free space is weak to the interrupt (intervention) from the outside, a wiring is not necessary, and, for example, it may be employed for data transmission between chips that are not easily wired due to the relation of the layout and the like.

For data transmission through the dielectric waveguide, although it is necessary to arrange a dielectric having a width that is in proportion to an RF signal used for the data transmission, for example, the wavelength in the electric wave of milli-wave zone, the signal of the milli-wave zone can be transmitted with high efficiency even for a long distance. Accordingly, for example, it can be employed for the data transmission between chips located relatively far from each other.

Although, in the data transmission through a metallic line, for data transmission for a relatively long distance, although it is difficult to ignore the resistance, and the efficiency is lowered, an area that is necessary for a wiring is small, and the electric field of the milli-wave zone can be concentrated on a small range. Accordingly, for example, it may be employed for data transmission between chips located close to each other or chips in which many wirings are arranged with a narrow interval or the like.

The input/output circuits 311, 312, 321, 411 to 415, 421, 431, and 441 are configured similarly to the input/output circuit 1 (FIG. 1), and, even in a case where any one of the free space, the dielectric waveguide, or the metallic line is used as the transmission medium, it is not necessary to remake the input/output circuits.

Accordingly, it is not necessary to remake the chips 310, 320, and 410 to 440 even in a case where any one of the free space, the dielectric, and the metallic line is used as the transmission medium.

In FIG. 7, although a free space is used as the transmission medium between the chips 310 and 320, a free space is used as the transmission medium between the chips 310 and 410, a plastic waveguide is used as the transmission medium between the chips 410 and 420, a metallic line is used as the transmission medium between the chips 410 and 430, and a free space is used as the transmission medium between the chips 410 and 440 respectively, the transmission media between the chips are not limited thereto.

In other words, for example, in FIG. 7, as the transmission medium between the chips 310 and 320, as the transmission medium between the chips 310 and 410, as the transmission medium between the chips 410 and 420, as the transmission medium between the chips 410 and 430, and as the transmission medium between the chips 410 and 440, free spaces as the same transmission media or the like can be used.

In addition, thereafter, for example, only the transmission medium between chips in which a plastic waveguide can be arranged may be changed from the free space to the plastic waveguide.

Here, the boards 300 and 400 are housed inside the casing of the electronic device, and, the inside of the casing is a sort of a closed space, whereby the communication environments inside the casing hardly change.

Accordingly, in data transmission through a free space inside the casing, an interference is a kind of steady, and a countermeasure for the interference can be set relatively in an easy manner.

Arrangement Example of Chip

Figure 8:
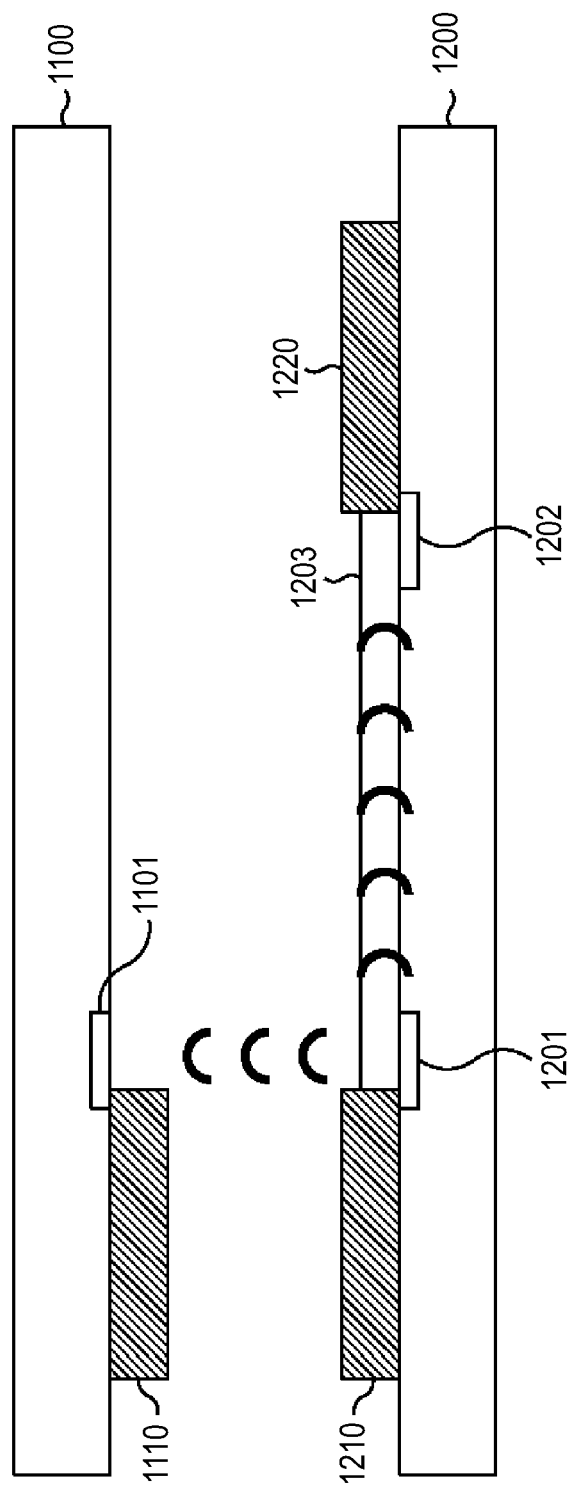
FIG. 8 is a cross-sectional view illustrating a first example of the arrangement of chips that configure the electronic device.

FIG. 8 is a cross-sectional view illustrating a first example of the arrangement of chips that configure the electronic device.

In FIG. 8, flat plate-shaped boards 1100 and 1200 are arranged in parallel to each other so as to allow the flat plated shaped faces face each other.

In the board 1100, a chip 1110 is mounted on the front face as one face and the rear face opposite thereto.

The chip 1110 includes an input/output circuit (not illustrated in the figure) configured similarly to the input/output circuit 1 (FIG. 1), and a coupler 1101 such as an antenna used for efficiently radiating electric waves of the milli-wave zone in a free space or a dielectric waveguide is connected to a portion corresponding to the pad 103 or 211 (FIG. 1) of the input/output circuit.

In the board 1200, chips 1210 and 1220 are mounted on the front face as one face.

Both the chips 1210 and 1220 include input/output circuits (not illustrated in the figure) configured similarly to the input/output circuit 1 (FIG. 1).

To portions of the input/output circuits included in the chips 1210 and 1220 that correspond to the pads 103 and 211

(FIG. 1), couplers 1201 and 1202 that are similar to the coupler 1101 are connected respectively.

In addition, in the board 1200, a strip-shaped plastic waveguide 1203 is arranged such that one end and the other end are brought into contact with the couplers 1201 and 1202 respectively.

In addition, the chip 1110 mounted on the board 1100 and the chip 1210 mounted on the board 1200 are arranged such that the couplers 1101 and 1201 face each other.

In the electronic device in which the chips 1110, 1210, and 1220 are arranged as above, the chip 1110 mounted on the board 1100 and the chip 1210 mounted on the other board 1200 perform data transmission by exchanging electric waves of the milli-wave zone through a free space.

In addition, the chips 1210 and 1220 mounted on the board 1200 perform data transmission by exchanging electric waves of the milli-wave zone through the plastic waveguide 1203.

Figure 9:
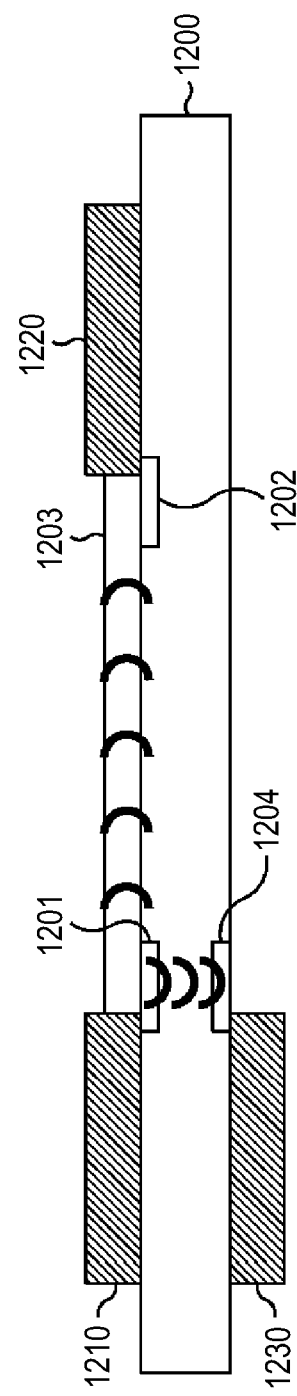
FIG. 9 is a cross-sectional view illustrating a second example of the arrangement of chips that configure an electronic device.

FIG. 9 is a cross-sectional view illustrating a second example of the arrangement of chips that configure an electronic device.

In the figure, to a portion corresponding to the case illustrated in FIG. 8, the same reference numeral is assigned, and the description thereof will be appropriately omitted.

In FIG. 9, similarly to the case illustrated in FIG. 8, on the front face of the board 1200, couplers 1201 and 1202, a plastic waveguide 1203, and chips 1210 and 1220 are disposed.

In addition, in FIG. 9, a chip 1230 is mounted on the rear face of the board 1200.

The chip 1230 includes an input/output circuit (not illustrated in the figure) configured similarly to the input/output circuit 1 (FIG. 1), and a coupler 1204 similar to the coupler 1101 (FIG. 8) such as an antenna used for efficiently radiating electric waves of the milli-wave zone in a free space or a dielectric waveguide is connected to a portion corresponding to the pad 103 or 211 (FIG. 1) of the input/output circuit (not illustrated in the figure).

In addition, in FIG. 9, in the board 1200, the chip 1210 mounted on the front face and the chip 1230 mounted on the rear face are arranged such that the couplers 1201 and 1204 face each other.

In the electronic device in which the chips 1210, 1220, and 1230 are arranged as above, the chips 1210 and 1220 mounted on the front face of the board 1200, similarly to the case illustrated in FIG. 8, perform data transmission by exchanging electric waves of the milli-wave zone through the plastic waveguide 1203.

In addition, the chip 1210 mounted on the front face of the board 1200 and the chip 1230 mounted on the rear face perform data transmission by exchanging electric waves of the milli-wave zone through the board 1200 as a free space (when the board 1200 is regarded as a dielectric waveguide, the board 1200 as the dielectric waveguide).

Figure 10:
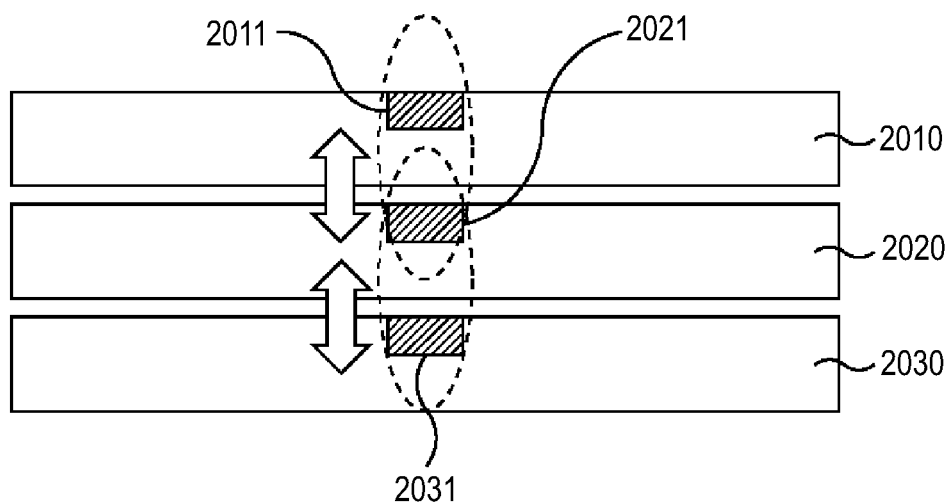
FIG. 10 is a cross-sectional view illustrating a third example of the arrangement of chips that configure an electronic device.

FIG. 10 is a cross-sectional view illustrating a third example of the arrangement of chips that configure an electronic device.

In FIG. 10, chips 2010, 2020, and 2030 having a flat plate shape are arranged so as to be stacked in the order from the upper side.

The chips 2010, 2020, and 2030 include input/output circuits 2011, 2021, and 2031 respectively configured similarly to the input/output circuit 1 (FIG. 1).

To all the portions of the input/output circuits 2011, 2021, and 2031 that correspond to the pads 103 and 211 (FIG. 1) (hereinafter, also referred to as an input/output pad), a coupler (not illustrated in the figure) such as an antenna used for efficiently radiating electric waves of the milli-wave zone in a free space or a dielectric waveguide is connected.

Here, on one face of the flat plate-shaped chip 2010, the input/output pad of the input/output circuit 2011 is exposed. Hereinafter, the face of the chip 2010 in which the input/output pad is exposed will be also referred to an exposed face.

In FIG. 10, all the chips 2010, 2020, and 2030 are stacked so as to face the exposed faces the upper side in the figure.

For example, now, when it is assumed that data transmission is performed between the chip 2010 and 2020 and between the chips 2020 and 2030, for the chips 2010, 2020, and 2030 having the exposed faces facing the upper side, it is difficult to dispose a metallic line or a dielectric waveguide between the chips 2010 and 2020 and between the chips 2020 and 2030.

Thus, in FIG. 10, between the chips 2010 and 2020 (between the input/output circuit 2011 and 2021) and between the chips 2020 and 2030 (between the input/output circuit 2021 and 2031), electric waves of the milli-wave zone are exchanged through free spaces, whereby data transmission is performed.

Figure 11:
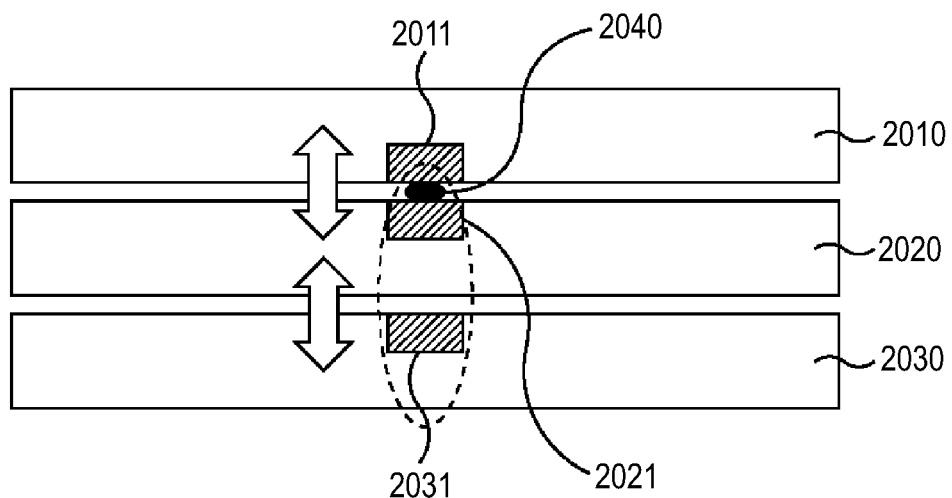
FIG. 11 is a cross-sectional view illustrating a fourth example of the arrangement of chips that configure an electronic device.

FIG. 11 is a cross-sectional view illustrating a fourth example of the arrangement of chips that configure an electronic device.

In the figure, to a portion corresponding to the case illustrated in FIG. 10, the same reference numeral is assigned, and the description thereof will be appropriately omitted.

In FIG. 11, similarly to the case illustrated in FIG. 10, chips 2010, 2020, and 2030 having a flat plate shape are arranged so as to be stacked in the order from the upper side.

However, in FIG. 11, while the chips 2020 and 2030, similarly to FIG. 10, are in the state in which the exposed faces face the upper side in the figure, the chip 2010 is in a state in which the exposed face faces the lower side in the figure.

In addition, the input/output pad of the chip 2010 (the input/output circuit 2011 thereof) and the input/output pad of the chip 2020 (the input/output circuit 2021 thereof) face each other and are connected by a bump (electrode) 2040 as a metallic line.

In FIG. 11, between the chips 2010 and 2020, data transmission is performed by exchanging electric waves of the milli-wave zone through the bump 2040 as a metallic line, and between the chips 2020 and 2030, data transmission is performed by exchanging electric waves of the milli-wave zone through a free space.

Method of Testing Chip

Figure 12:
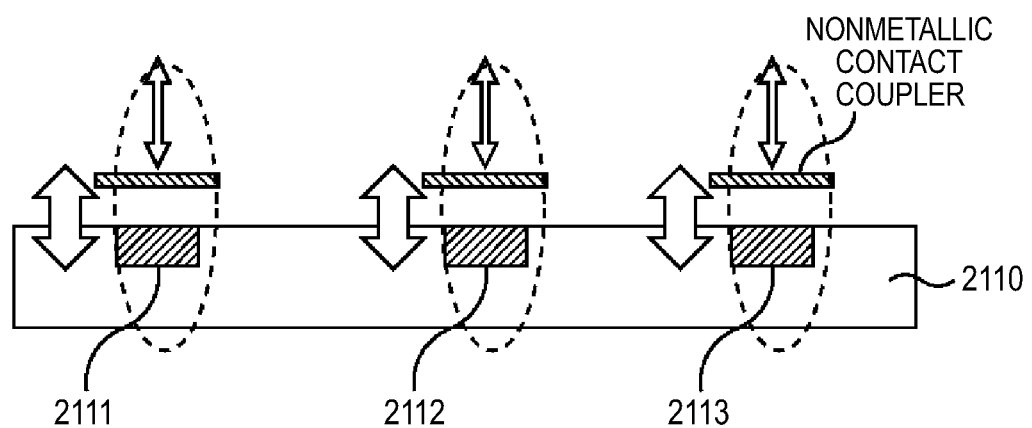
FIG. 12 is a cross-sectional view illustrating a method of testing a chip including an input/output circuit that is configured similarly to the input/output circuit 1.

FIG. 12 is a cross-sectional view illustrating a method of testing for checking the operation of a chip including an input/output circuit that is configured similarly to the input/output circuit 1 (FIG. 1) or the like.

In FIG. 12, the chip 2110 includes input/output circuits 2111, 2112, and 2113 that are configured similarly to the input/output circuit 1 (FIG. 1).

In addition, in FIG. 12, of two faces of the flat plate-shaped chip 2110, an upper face in the figure configures an exposed face in which the input/output pads of the input/output circuits 2111, 2112, and 2113 are exposed.

In order to check the operation of the chip 2110, it is necessary to exchange signals between the input/output circuits 2111, 2112, and 2113.

As a method of exchanging signals between each of the input/output circuits 2111, 2112, and 2113, for example, there is a method in which a probe (metal) for measurement is brought into contact with the input/output pad of the input/output circuits 2111, 2112, and 2113, and signals exchanged between each of the input/output circuits 2111, 2112, and 2113 are measured through the probe.

However, in a case where the probe is brought into contact with the input/output pads of the input/output circuits 2111, 2112, and 2113, the input/output pad may be damaged due to the occurrence of a scratch in the input/output pad or the like.

Thus, in the test for the input/output circuits 2111, 2112, and 2113, by exchanging signals between each of the input/output circuits 2111, 2112, and 2113 through a free space by using a nonmetal contact couple, signals exchanged between each of the input/output circuits 2111, 2112, and 2113 can be measured without physically being in contact with the input/output pads.

In FIG. 12, the nonmetallic contact coupler can approach the exposed face of the chip 2110, and signals are exchanged between the nonmetallic contact coupler and each of the input/output circuits 2111, 2112, and 2113.

In the input/output circuits 2111, 2112, and 2113 configured similarly to the input/output circuit 1 (FIG. 1), any one of a free space, a dielectric waveguide, and a metallic line can be used as the transmission medium, and accordingly, by using the free space as the transmission medium, a noninvasive test, that is, a test that does not cause any damage to the input/output pads can be performed.

FIGS. 13A and 13B are cross-sectional views illustrating the mounting of a chip 2110 illustrated in FIG. 12 after a noninvasive test is performed.

FIG. 13A is a cross-sectional view illustrating an example of the mounting of the chip 2110 using an interposer.

In FIG. 13A, the chip 2110 and the interposer 2200 are arranged so as to be stacked.

Inside the interposer 2200, metallic lines 2201, 2202, and 2203 are wired, and one ends of the metallic lines 2201, 2202, and 2203 are connected to bumps 2210, 2220, and 2230 that are disposed on one face of the flat plate-shaped interposer 2200.

In addition, the interposer 2200 is stacked such that the bumps 2210, 2220, and 2230 are connected respectively to the input/output pads of the input/output circuits 2111, 2112, and 2113.

The input/output circuit 2111 performs data transmission for another chip (a chip other than the chip 2110) through the bump 2210 and the metallic line 2201. Similarly, the input/output circuit 2112 performs data transmission for another chip through the bump 2220 and the metallic line 2202. In addition, the input/output circuit 2113 performs data transmission for another chip through the bump 2230 and the metallic line 2203.

FIG. 13B is a cross-sectional view illustrating an example of mounting of the chip 2110 not by using an interposer.

In FIG. 13B, chips 2110, 2310, and 2410 having a flat plate shape are arranged so as to be stacked in the order from the lower side.

The chip 2310 includes input/output circuits 2311 and 2312 configured similarly to the input/output circuit 1 (FIG. 1).

The chip 2410 includes input/output circuits 2411 and 2412 configured similarly to the input/output circuit 1 (FIG. 1).

In FIG. 13B, the chip 2110 in a state in which the exposed face faces the upper side, the chip 2310 in a state in which the exposed face faces the lower side, and the chip 2410 in a state in which the exposed face faces the lower side are stacked respectively.

In addition, the input/output pad of the input/output circuit 2111 of the chip 2110 and the input/output pad of the input/output circuit 2311 of the chip 2310 face each other and are connected by a bump 2320 as a metallic line.

Furthermore, the input/output pad of the input/output circuit 2113 of the chip 2110 and the input/output pad of the input/output circuit 2312 of the chip 2310 face each other and are connected by a bump 2330 as a metallic line.

In addition, between the input/output circuit 2111 of the chip 2110 and the input/output circuit 2311 of the chip 2310, data transmission is performed by exchanging electric waves of the milli-wave zone through the bump 2320 as a metallic line.

Similarly, between the input/output circuit 2113 of the chip 2110 and the input/output circuit 2312 of the chip 2310, data transmission is performed by exchanging electric waves of the milli-wave zone through the bump 2330 as a metallic line.

In addition, between the input/output circuit 2112 of the chip 2110 and the input/output circuits 2411 and 2412 of the chip 2410, data transmission is performed by exchanging electric waves of the milli-wave zone through a free space.

Furthermore, the data transmission between the input/output circuit 2112 of the chip 2110 and each of the input/output circuits 2411 and 2412 of the chip 2410 may be performed in a form in which the input/output circuit 2112 broadcasts the data to both the input/output circuits 2411 and 2412. Alternatively, the data transmission may be independently performed between the input/output circuits 2112 and 2411 and between the input/output circuits 2112 and 2412 respectively.

As a method of performing data transmission between the input/output circuit 2112 of the chip 2110 and each of the input/output circuits 2411 and 2412 of the chip 2410 independently between the input/output circuits 2112 and 2411 and between the input/output circuits 2112 and 2412, for example, there is a method of performing data transmission through frequency division in which the frequencies of the carriers of the electric waves of the milli-wave zone that are used for the data transmission between the input/output circuits 2112 and 2411 and the electric waves of the milli-wave zone that are used for the data transmission between the input/output circuits 2112 and 2412 are differently set. In addition, as a method of performing data transmission independently between the input/output circuits 2112 and 2411 and between the input/output circuits 2112 and 2412, for example, there is a method of performing data transmission through time division or code division.

FIG. 14 is a cross-sectional view illustrating a method of testing the chip 2110 after being mounted.

In other words, FIG. 14 illustrates the chip 2110 for which the mounting of the interposer 2200 illustrated in FIG. 13A is performed so as to be stacked.

In FIG. 14, a nonmetallic contact coupler can approach a face located on a side opposite to the exposed face of the chip 2110, and signals are exchanged between the nonmetallic contact coupler and each of the input/output circuits 2111, 2112, and 2113.

Since the input/output circuits 2111, 2112, and 2113 configured similarly to the input output circuit 1 (FIG. 1) can use any one of a free space, a dielectric waveguide, and a metallic line as the transmission medium, by receiving a signal leaking to the free space as the transmission medium from the input/output pads of the input/output circuits 2111, 2112, and 2113 by using a nonmetallic contact coupler, for the chip 2110 after being mounted to be in a state in which the input/output pad is not exposed by stacking the interposer 2200, a test for checking the operation can be performed.

Figure 16:
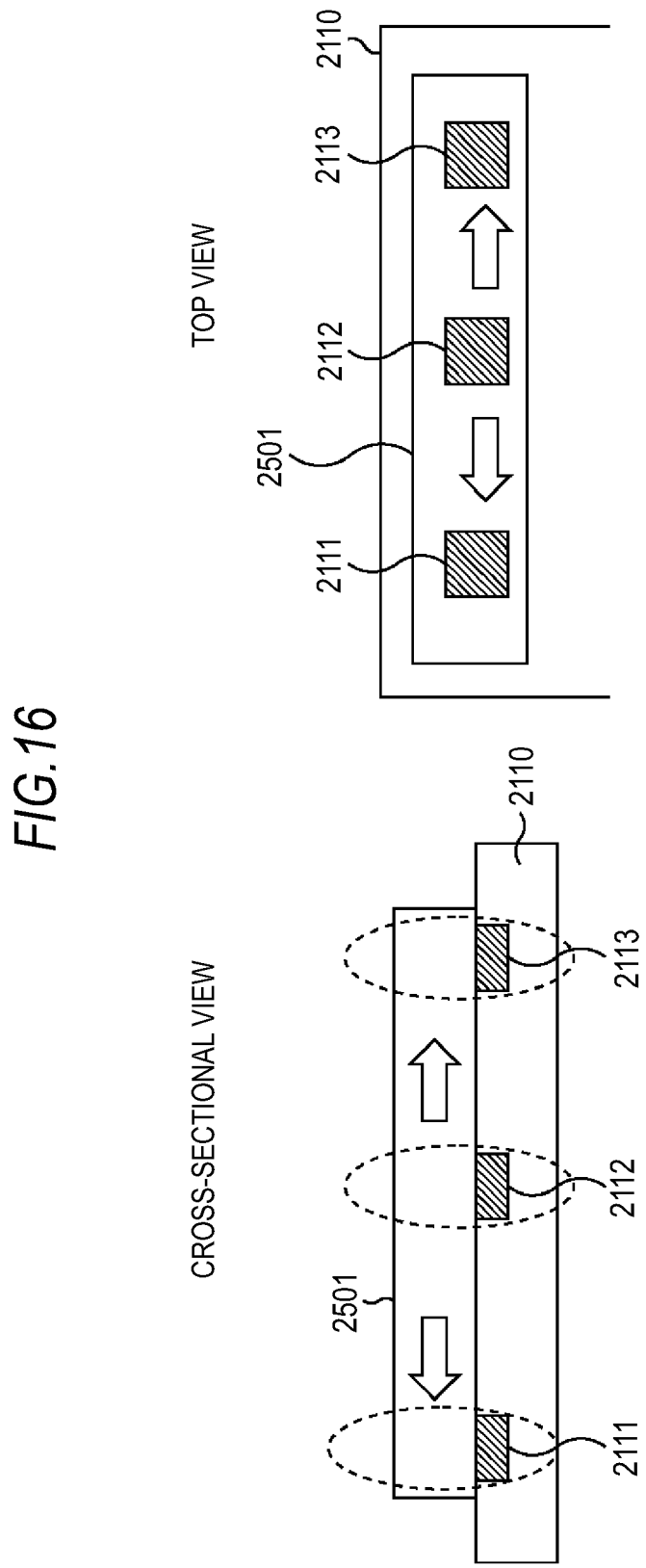
FIG. 16 is a diagram illustrating a loopback testing method for the chip.

FIGS. 15 to 17 are diagrams illustrating a loopback testing method for the chip 2110 illustrated in FIG. 12.

FIG. 15 illustrates a cross-sectional view of the chip 2110 and a top view in a case where the exposed face is configured as the top face.

For example, now, a signal is transmitted from the input/output circuit 2112, and the signal is received by the input/output circuit 2111 or 2113, whereby the loop back test is performed.

FIG. 16 is a diagram illustrating a method of performing a loopback test in which a signal transmitted by the input/output circuit 2112 is received by both the input/output circuits 2111 and 2113.

In FIG. 16 (similarly, in FIG. 17 to be described later), a cross-sectional view and a top view of the chip 2110 are illustrated.

In a case where the signal transmitted by the input/output circuit 2112 is received by both the input/output circuits 2111 and 2113, as illustrated in FIG. 16, a strip-shaped dielectric 2501 is arranged as a dielectric waveguide so as to cover all the input/output pads of the input/output circuits 2111, 2112, and 2113.

Accordingly, the signal transmitted by the input/output circuit 2112 is received by each of the input/output circuits 2111 and 2113 through the dielectric 2501.

In addition, by connecting an antenna having a length shorter than ½ of the wavelength λ of the signal transmitted by the input/output circuit 2112 to the input/output pad of the input/output circuits 2111, 2112, and 2113, the wavelength of the signal transmitted by the input/output circuit 2112 is shortened equivalently when the dielectric 2501 having a high dielectric constant is arranged, whereby signals can be efficiently transmitted and received between the input/output circuit 2112 and each of the input/output circuits 2111 and 2113.

FIG. 17 is a diagram illustrating a loopback testing method in which a signal transmitted by the input/output circuit 2112 is received, for example, only by the input/output circuit 2111 out of the input/output circuits 2111 and 2113.

In a case where the signal transmitted by the input/output circuit 2112 is received only by the input/output circuit 2111, as illustrated in FIG. 17, a stripe-shape dielectric 2511 is arranged as a dielectric waveguide so as to cover only from the input/output pad of the input/output circuit 2111 to the input/output pad of the input circuit 2112.

Accordingly, the signal transmitted by the input/output circuit 2112 is received only by the input/output circuit 2111 through the dielectric 2511.

As above, by arranging the dialectic 2501 or 2511, the loopback test can be performed.

In addition, embodiments of the present technology are not limited to the above-described embodiments, and various changes may be made therein in a range not departing from the concept of the present technology.

For example, in the input/output circuit 1 (FIG. 1), the RF signal used for data transmission is not limited to a signal of the milli-wave zone.

In addition, the present technology may be implemented in the following configurations.

[1] A signal processing device including: a plurality of signal processing circuits. The signal processing circuit includes an input/output circuit that is configured by one or both of an input circuit that serves as an input interface of a signal of a predetermined frequency band and an output circuit that serves as an output interface of a signal of the predetermined frequency band and performs transmission of a signal of the predetermined frequency band between the signal processing circuit and another signal processing circuit, the output circuit of one of the signal processing circuits and the output circuit of another signal processing circuit include circuits having the same configuration, the input circuit of the one signal processing circuit and the input circuit of the another signal processing circuit include other circuits having the same configurations, and the input/output circuit of the one signal processing circuit and the input/output circuit of the another signal processing circuit can perform transmission of a signal of the predetermined frequency band even in a case where any one of a plurality of transmission media having mutually different characteristics is mediated.

[2] The signal processing device described in [1], wherein the signal of the predetermined frequency bandwidth is a signal of a milli-wave zone.

[3] The signal processing device described in [2], wherein the circuits having the same configuration are conversion circuits that convert a baseband signal into a signal of the milli-wave zone, and the other circuits having the same configurations are reverse conversion circuits that perform reverse conversion of the signal of the milli-wave zone into the baseband signal.

[4] The signal processing device described in any one of [1] to [3], wherein the plurality of transmission media having mutually different characteristics are a plurality of transmission media of different types.

[5] The signal processing device described in [4], wherein the plurality of transmission media of different types are two or more of a free space, a dielectric waveguide, and a metallic line.

[6] The signal processing device described in any one of [1] to [5], wherein out of the plurality of the signal processing circuits, at least one pair of the signal processing circuits performs transmission of a signal of the predetermined frequency band therebetween through a transmission medium having predetermined characteristics, and at least another pair of the signal processing circuits performs transmission of a signal of the predetermined frequency band therebetween through a transmission medium having characteristics different from the predetermined characteristics.

[7] The signal processing device described in any one of [1] to [6], wherein the signal processing circuit includes a plurality of the input/output circuits.

[8] The signal processing device described in any one of [1] to [7], wherein the one pair of the signal processing circuits that perform transmission of a signal of the predetermined frequency band are disposed on different boards.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing device comprising:
a plurality of signal processing circuits, each signal processing circuit of the plurality of signal processing circuits including an input/output circuit that includes an input circuit configured to receive a signal of a predetermined frequency band at a pad of an input interface and an output circuit that outputs a signal of a predetermined frequency band at a pad of an output interface, wherein a first signal processing circuit of the plurality of signal processing circuits is configured to transmit a signal of the predetermined frequency band between the first signal processing circuit and a second signal processing circuit of the plurality of signal processing circuits,
wherein the output circuit of the first signal processing circuit and the output circuit of the second signal processing circuit have the same configuration,
wherein the input circuit of the first signal processing circuit and the input circuit of the second signal processing circuit have the same configuration, wherein, without the signal processing circuits being remade
the pad of the output circuit of the first signal processing circuit is configured to output a signal of the predetermined frequency band to the pad of the input circuit of the second signal processing circuit when a first transmission medium is utilized, and
the pad of the output circuit of the first signal processing circuit is configured to output a signal of the predetermined frequency band to the pad of the input circuit of the second signal processing circuit when a second transmission medium is utilized, wherein the first and second transmission medium have different transmission characteristics.

2. The signal processing device according to claim 1, wherein the signal of the predetermined frequency bandwidth is a signal of a milli-wave zone.

3. The signal processing device according to claim 2, wherein the output circuit of the first and second signal processing circuits are conversion circuits that convert a baseband signal into a signal of the milli-wave zone, and
wherein the input circuit of the first and second signal processing circuits are reverse conversion circuits that perform reverse conversion of the signal of the milli-wave zone into the baseband signal.

4. The signal processing device according to claim 3, wherein the first and second transmission media having different transmission characteristics includes the same type of transmission media having different transmission characteristics.

5. The signal processing device according to claim 4, wherein the plurality of transmission media includes a metallic line and at least one of a free space and a dielectric waveguide.

6. The signal processing device according to claim 4, wherein, out of the plurality of the signal processing circuits, at least one pair of the signal processing circuits performs transmission of a signal of the predetermined frequency band therebetween through a transmission medium having predetermined characteristics, and at least another pair of the signal processing circuits performs transmission of a signal of the predetermined frequency band therebetween through a transmission medium having characteristics different from the predetermined characteristics.

7. The signal processing device according to claim 6, wherein the pair of the signal processing circuits that perform transmission of a signal of the predetermined frequency band are disposed on different boards.

8. The signal processing device according to claim 4, wherein at least one signal processing circuit of the plurality of signal processing circuits includes a plurality of the input/output circuits.

9. The signal processing device according to claim 1, wherein the signal of the predetermined frequency band output from the pad of the output circuit of the first signal processing circuit is a multiplexed signal.

10. The signal processing device according to claim 9, wherein the signal of the predetermined frequency band provided to the pad of the input circuit of the second signal processing circuit is a multiplexed signal.

11. The signal processing device according to claim 1, wherein only one of the first and second transmission mediums is utilized at any one time between the output circuit of the first signal processing circuit and the input circuit of the second signal processing circuit.

12. A communication system for communicating between a first chip and one or more other chips, the first chip comprising:
a core; and
a plurality of input/output circuits having the same configuration, each of the plurality of input/output circuits including an input circuit configured to receive a signal of a predetermined frequency band at a pad of an input interface and an output circuit that outputs a signal of a predetermined frequency band at a pad of an output interface, wherein at least one of the plurality of input/output circuit circuits is configured to transmit a signal of the predetermined frequency band between the first chip and the one or more other chips,
wherein the output circuit of each of the plurality of input/output circuits of the first chip and the output circuit of the one or more other chips have the same configuration,
wherein the input circuit of each of the plurality of input/output circuits of the first chip and the input circuit of the one or more other chips have the same configurations,
wherein a first of the plurality of input/output circuits of the first chip is configured to transmit a first signal of the predetermined frequency band to a first of the one or more other chips utilizing a first transmission medium, and a second of the plurality of input/output circuits of the first chip is configured to transmit a second signal of a predetermined frequency band to a second of the one or more other chips utilizing a second transmission medium such that without being remade, the pad of the output interface of the first of the plurality of input/output circuits of the first chip and the pad of the output interface of the second of the plurality of input/output circuits of the first chip are configured to output a signal of the predetermined frequency band utilizing any one of a plurality of transmission media having different transmission characteristics, wherein the transmission characteristics of the first transmission medium and the second transmission medium are different.

13. The communication system according to claim 12, wherein the signal of the predetermined frequency bandwidth is a signal of a milli-wave zone.

14. The communication system according to claim 13, wherein the output circuits having the same configuration are conversion circuits that convert a baseband signal into a signal of the milli-wave zone, and
wherein the input circuits having the same configurations are reverse conversion circuits that perform reverse conversion of the signal of the milli-wave zone into the baseband signal.

15. The communication system according to claim 12, wherein the first and second transmission medium include the same type of transmission media having different transmission characteristics.

16. The communication system according to claim 15, wherein the plurality of transmission media include a metallic line and at least one of a free space and a dielectric waveguide.

17. The communication system according to claim 12, wherein the chip and the one or more other chips are disposed on different boards.

* * * * *